United States Patent
Khlat et al.

(10) Patent No.: US 11,165,413 B2
(45) Date of Patent: Nov. 2, 2021

(54) COUPLED RESONATOR STRUCTURE

(71) Applicant: Qorvo US, Inc., Greensboro, NC (US)

(72) Inventors: Nadim Khlat, Cugnaux (FR); Robert Aigner, Ocoee, FL (US)

(73) Assignee: Qorvo US, Inc., Greensboro, NC (US)

( * ) Notice: Subject to any disclaimer, the term of this patent is extended or adjusted under 35 U.S.C. 154(b) by 239 days.

(21) Appl. No.: 15/883,933

(22) Filed: Jan. 30, 2018

(65) Prior Publication Data

US 2018/0219530 A1 Aug. 2, 2018

Related U.S. Application Data

(60) Provisional application No. 62/451,915, filed on Jan. 30, 2017.

(51) Int. Cl.
| | |
|---|---|
| *H03H 9/60* | (2006.01) |
| *H03H 9/00* | (2006.01) |
| *H03H 9/58* | (2006.01) |
| *H03H 9/205* | (2006.01) |
| *H03H 9/13* | (2006.01) |
| H03H 9/02 | (2006.01) |
| H03H 9/64 | (2006.01) |
| H03H 9/145 | (2006.01) |

(52) U.S. Cl.
CPC .......... *H03H 9/605* (2013.01); *H03H 9/0014* (2013.01); *H03H 9/133* (2013.01); *H03H 9/205* (2013.01); *H03H 9/584* (2013.01); *H03H 9/589* (2013.01); *H03H 9/02874* (2013.01); *H03H 9/14544* (2013.01); *H03H 9/6469* (2013.01); *H03H 9/6483* (2013.01)

(58) Field of Classification Search
CPC .... H03H 9/0014; H03H 9/0095; H03H 9/581; H03H 9/582; H03H 9/583; H03H 9/584; H03H 9/587; H03H 9/588; H03H 9/589; H03H 9/605; H03H 9/13; H03H 9/133; H03H 9/205; H03H 9/17; H03H 9/171; H03H 9/178
USPC ........................................................ 333/189
See application file for complete search history.

(56) References Cited

U.S. PATENT DOCUMENTS

| | | | |
|---|---|---|---|
| 3,731,230 | A | 5/1973 | Cerny, Jr. |
| 3,875,533 | A | 4/1975 | Irwin et al. |
| 4,442,434 | A | 4/1984 | Baekgaard |
| 4,577,168 | A | 3/1986 | Hartmann |
| 5,291,159 | A | 3/1994 | Vale |
| 6,067,391 | A | 5/2000 | Land |

(Continued)

FOREIGN PATENT DOCUMENTS

| | | |
|---|---|---|
| JP | 2012257050 A | 12/2012 |

OTHER PUBLICATIONS

Larson, John, et al., "Characterization of Reversed c-axis AlN Thin Films," International Ultrasonics Symposium Proceedings, 2010, IEEE, pp. 1054-1059.

(Continued)

*Primary Examiner* — Barbara Summons
(74) *Attorney, Agent, or Firm* — Withrow & Terranova, PLLC

(57) ABSTRACT

Various arrangements for electrically coupling the electrodes of coupled resonator structures (CRSes) to form unique two- and three-terminal devices as well as the use of such CRSes in filter networks are disclosed.

9 Claims, 24 Drawing Sheets

(56) References Cited

U.S. PATENT DOCUMENTS

| | | | |
|---|---|---|---|
| 6,670,866 B2* | 12/2003 | Ella | H03H 9/0095 |
| | | | 310/366 |
| 6,714,099 B2 | 3/2004 | Hikita et al. | |
| 6,720,844 B1 | 4/2004 | Lakin | |
| 6,927,649 B2 | 8/2005 | Metzger et al. | |
| 6,927,651 B2 | 8/2005 | Larson, III et al. | |
| 6,975,183 B2 | 12/2005 | Aigner et al. | |
| 7,057,478 B2 | 6/2006 | Korden et al. | |
| 7,173,504 B2 | 2/2007 | Larson, III et al. | |
| 7,239,067 B2 | 7/2007 | Komuro et al. | |
| 7,321,183 B2 | 1/2008 | Ebuchi et al. | |
| 7,342,351 B2 | 3/2008 | Kubo et al. | |
| 7,367,095 B2 | 5/2008 | Larson, III et al. | |
| 7,391,285 B2 | 6/2008 | Larson, III et al. | |
| 7,436,269 B2 | 10/2008 | Wang et al. | |
| 7,515,018 B2 | 4/2009 | Handtmann et al. | |
| 7,804,374 B1 | 9/2010 | Brown et al. | |
| 7,825,749 B2 | 11/2010 | Thalhammer et al. | |
| 7,855,618 B2* | 12/2010 | Frank | H03H 9/0095 |
| | | | 333/187 |
| 7,889,024 B2 | 2/2011 | Bradley et al. | |
| 7,898,493 B1 | 3/2011 | Rojas et al. | |
| 7,956,705 B2 | 6/2011 | Meister et al. | |
| 7,973,620 B2 | 7/2011 | Shirakawa et al. | |
| 8,248,185 B2 | 8/2012 | Choy et al. | |
| 8,508,315 B2 | 8/2013 | Jamneala et al. | |
| 8,575,820 B2 | 11/2013 | Shirakawa et al. | |
| 8,576,024 B2 | 11/2013 | Erb et al. | |
| 8,923,794 B2 | 12/2014 | Aigner | |
| 8,981,627 B2 | 3/2015 | Sakuma et al. | |
| 8,991,022 B2 | 3/2015 | Satoh et al. | |
| 9,054,671 B2 | 6/2015 | Adkisson et al. | |
| 9,054,674 B2 | 6/2015 | Inoue et al. | |
| 9,197,189 B2* | 11/2015 | Miyake | H03H 9/0095 |
| 9,243,316 B2 | 1/2016 | Larson, III et al. | |
| 9,484,883 B2 | 11/2016 | Nishizawa et al. | |
| 9,698,756 B2 | 7/2017 | Khlat et al. | |
| 9,837,984 B2 | 12/2017 | Khlat et al. | |
| 9,847,769 B2 | 12/2017 | Khlat et al. | |
| 9,887,686 B2 | 2/2018 | Kuwahara | |
| 9,929,716 B2 | 3/2018 | Lee et al. | |
| 10,009,001 B2 | 6/2018 | Jiang et al. | |
| 2002/0109564 A1 | 8/2002 | Tsai et al. | |
| 2004/0100342 A1 | 5/2004 | Nishihara et al. | |
| 2005/0057117 A1 | 3/2005 | Nakatsuka et al. | |
| 2005/0093648 A1 | 5/2005 | Inoue | |
| 2005/0206476 A1 | 9/2005 | Ella et al. | |
| 2006/0091978 A1 | 5/2006 | Wang et al. | |
| 2008/0007369 A1 | 1/2008 | Barber et al. | |
| 2008/0169884 A1 | 7/2008 | Matsumoto et al. | |
| 2008/0297278 A1* | 12/2008 | Handtmann | H03H 9/0095 |
| | | | 333/189 |
| 2009/0096549 A1 | 4/2009 | Thalhammer et al. | |
| 2009/0096550 A1 | 4/2009 | Handtmann et al. | |
| 2010/0277237 A1 | 11/2010 | Sinha et al. | |
| 2011/0115334 A1 | 5/2011 | Konishi et al. | |
| 2011/0121689 A1 | 5/2011 | Grannen et al. | |
| 2011/0204995 A1 | 8/2011 | Jamneala et al. | |
| 2011/0210787 A1 | 9/2011 | Lee et al. | |
| 2012/0007696 A1 | 1/2012 | Pang et al. | |
| 2012/0187799 A1 | 7/2012 | Nakahashi | |
| 2012/0313725 A1 | 12/2012 | Ueda et al. | |
| 2013/0033150 A1 | 2/2013 | Bardong et al. | |
| 2013/0113576 A1 | 5/2013 | Inoue et al. | |
| 2013/0193808 A1 | 8/2013 | Feng et al. | |
| 2014/0132117 A1 | 5/2014 | Larson, III | |
| 2014/0145557 A1 | 5/2014 | Tanaka | |
| 2014/0167565 A1 | 6/2014 | Iwamoto | |
| 2015/0222246 A1 | 8/2015 | Nosaka | |
| 2015/0280100 A1 | 10/2015 | Burak et al. | |
| 2015/0369153 A1 | 12/2015 | Tsunooka et al. | |
| 2016/0028364 A1 | 1/2016 | Takeuchi | |
| 2016/0056789 A1 | 2/2016 | Otsubo et al. | |
| 2016/0191012 A1 | 6/2016 | Khlat et al. | |
| 2016/0191014 A1 | 6/2016 | Khlat et al. | |
| 2016/0191016 A1 | 6/2016 | Khlat et al. | |
| 2016/0261235 A1 | 9/2016 | Ortiz | |
| 2016/0268998 A1 | 9/2016 | Xu et al. | |
| 2016/0308576 A1 | 10/2016 | Khlat et al. | |
| 2016/0359468 A1 | 12/2016 | Taniguchi et al. | |
| 2017/0093369 A1 | 3/2017 | Khlat et al. | |
| 2017/0093370 A1 | 3/2017 | Khlat et al. | |
| 2017/0141757 A1 | 5/2017 | Schmidhammer | |
| 2017/0201233 A1 | 7/2017 | Khlat | |
| 2017/0301992 A1 | 10/2017 | Khlat et al. | |
| 2017/0324159 A1 | 11/2017 | Khlat | |
| 2017/0338795 A1 | 11/2017 | Nakagawa et al. | |
| 2018/0013402 A1 | 1/2018 | Kirkpatrick et al. | |
| 2018/0041191 A1 | 2/2018 | Park | |
| 2018/0076793 A1 | 3/2018 | Khlat et al. | |
| 2018/0076794 A1 | 3/2018 | Khlat et al. | |
| 2018/0109236 A1 | 4/2018 | Konoma | |
| 2018/0109237 A1 | 4/2018 | Wasilik et al. | |
| 2018/0145658 A1 | 5/2018 | Saji | |
| 2018/0241418 A1 | 8/2018 | Takamine et al. | |
| 2019/0140618 A1 | 5/2019 | Takamine | |
| 2019/0181835 A1 | 6/2019 | Timme et al. | |
| 2019/0199320 A1 | 6/2019 | Morita et al. | |
| 2019/0207583 A1 | 7/2019 | Miura et al. | |
| 2019/0222197 A1 | 7/2019 | Khlat et al. | |
| 2019/0288664 A1 | 9/2019 | Saji | |
| 2019/0305752 A1 | 10/2019 | Sadhu et al. | |

OTHER PUBLICATIONS

Final Office Action for U.S. Appl. No. 14/757,651, dated Sep. 19, 2018, 7 pages.
Non-Final Office Action for U.S. Appl. No. 15/701,759, dated Oct. 4, 2018, 10 pages.
Notice of Allowance for U.S. Appl. No. 15/727,117, dated Mar. 13, 2019, 9 pages.
Non-Final Office Action for U.S. Appl. No. 15/586,374, dated Feb. 26, 2019, 16 pages.
Notice of Allowance for U.S. Appl. No. 15/720,706, dated Mar. 15, 2019, 9 pages.
Non-Final Office Action for U.S. Appl. No. 14/757,587, dated Sep. 13, 2016, 12 pages.
Notice of Allowance for U.S. Appl. No. 14/757,587, dated Mar. 9, 2017, 8 pages.
Non-Final Office Action for U.S. Appl. No. 15/004,084, dated Jun. 12, 2017, 9 pages.
Non-Final Office Action for U.S. Appl. No. 14/757,651, dated Jun. 9, 2017, 11 pages.
Non-Final Office Action for U.S. Appl. No. 15/275,957, dated Jun. 14, 2017, 9 pages.
Ex Parte Quayle Action for U.S. Appl. No. 15/347,452, dated Jun. 15, 2017, 7 pages.
Final Office Action for U.S. Appl. No. 15/275,957, dated Jan. 2, 2018, 7 pages.
Author Unknown, "SAW Filters—SAW Resonators: Surface Acoustic Wave SAW Components," Product Specification, 2010, Token Electronics Industry Co., Ltd., 37 pages.
Fattinger, Gernot et al., "Miniaturization of BAW Devices and the Impact of Wafer Level Packaging Technology," Joint UFFC, EFTF and PFM Symposium, Jul. 21-25, 2013, Prague, Czech Republic, IEEE, pp. 228-231.
Kwa, Tom, "Wafer-Level Packaged Accelerometer With Solderable SMT Terminals," IEEE Sensors, Oct. 22-25, 2006, Daegu, South Korea, IEEE, pp. 1361-1364.
Lakin, K. M., "Coupled Resonator Filters," 2002 IEEE Ultrasonics Symposium, Oct. 8-11, 2002, Munich, Germany, 8 pages.
López, Edén Corrales, "Analysis and Design of Bulk Acoustic Wave Filters Based on Acoustically Coupled Resonators," PhD Thesis, Department of Telecommunications and Systems Engineering, Autonomous University of Barcelona, May 2011, 202 pages.
Potter, Bob R. et al., "Embedded Inductors Incorporated in the Design of SAW Module SMT Packaging," Proceedings of the 2002 Ultrasonics Symposium, Oct. 8-11, 2002, IEEE, pp. 397-400.

(56) References Cited

OTHER PUBLICATIONS

Schneider, Robert, "High-Q AlN Contour Mode Resonators with Unattached, Voltage-Actuated Electrodes," Thesis, Technical Report No. UCB/EECS-2015-247, Dec. 17, 2015, Electrical Engineering and Computer Sciences, University of California at Berkeley, http://www.eecs.berkeley.edu/Pubs/TechRpts/2015/EECS-2015-247. html, Robert Anthony Schneider, 222 pages.

Shirakawa, A. A., et al., "Bulk Acoustic Wave-Coupled Resonator Filters: Concept, Design, and Application," International Journal of RF and Microwave Computer-Aided Engineering, vol. 21, No. 5, Sep. 2011, 9 pages.

Corrales, Eden, et al., "Design of Three-Pole Bulk Acoustic Wave Coupled Resonator Filters," 38th European Microwave Conference, Oct. 2008, Amsterdam, Netherlands, EuMA, pp. 357-360.

De Paco, Pedro, et al., "Equivalent Circuit Modeling of Coupled Resonator Filters," Transactions on Ultrasonics, Ferroelectrics, and Frequency Control, vol. 55, Issue 9, Sep. 2008, IEEE, pp. 2030-2037.

Lakin, K. M., "Bulk Acoustic Wave Coupled Resonator Filters," International Frequency Control Symposium, 2002, IEEE, pp. 8-14.

Shirakawa, A. A., et al., "Bulk Acoustic Wave Coupled Resonator Filters Synthesis Methodology," European Microwave Conference, Oct. 4-6, 2005, Paris, France, IEEE, 4 pages.

Tosic, Dejan, et al., "Symbolic analysis of immitance inverters," 14th Telecommunications Forum, Nov. 21-23, 2006, Belgrade, Serbia, pp. 584-487.

Non-Final Office Action for U.S. Appl. No. 14/757,651, dated May 8, 2018, 8 pages.

Notice of Allowance for U.S. Appl. No. 15/347,428, dated Jul. 12, 2018, 9 pages.

Notice of Allowance for U.S. Appl. No. 15/490,381, dated May 23, 2018, 8 pages.

Non-Final Office Action for U.S. Appl. No. 15/697,658, dated May 1, 2019, 13 pages.

Notice of Allowance for U.S. Appl. No. 15/586,374, dated Oct. 4, 2019, 7 pages.

Notice of Allowance for U.S. Appl. No. 15/644,922, dated Oct. 21, 2019, 10 pages.

Final Office Action for U.S. Appl. No. 15/697,658, dated Oct. 22, 2019, 9 pages.

U.S. Appl. No. 16/358,823, filed Mar. 20, 2019.

Capilla, Jose et al., "High-Acoustic-Impedence Tantalum Oxide Layers for Insulating Acoustic Reflectors," IEEE Transactions on Ultrasonics, Ferroelectrics, and Frequency Control, vol. 59, No. 3, Mar. 2012, IEEE, pp. 366-372.

Fattinger, Gernot et al., ""Single-to-balanced Filters for Mobile Phones using Coupled Resonator BAW Technology,"" 2004 IEEE International Ultrasonics, Ferroelectrics, and Frequency Control Joint 50th Anniversary Conference, Aug. 23-27, 2004, IEEE, pp. 416-419.

Lakin, K. M. et al., "High Performance Stacked Crystal Filters for GPS and Wide Bandwidth Applications," 2001 IEEE Ultrasonics Symposium, Oct. 7-10, 2001, IEEE, pp. 833-838.

Roy, Ambarish et al., "Spurious Modes Suppression in Stacked Crystal Filter," 2010 IEEE Long Island Systems, Applications and Technology Conference, May 7, 2010, 6 pages.

Non-Final Office Action for U.S. Appl. No. 16/003,417, dated Apr. 3, 2020, 9 pages.

Non-Final Office Action for U.S. Appl. No. 16/290,175, dated Apr. 14, 2020, 29 pages.

Notice of Allowance and Examiner-Initiated Interview Summary for U.S. Appl. No. 16/003,417, dated Aug. 5, 2020, 9 pages.

Final Office Action for U.S. Appl. No. 16/290,175, dated Sep. 17, 2020, 13 pages.

Non-Final Office Action for U.S. Appl. No. 16/283,044, dated Nov. 12, 2020, 9 pages.

Notice of Allowance for U.S. Appl. No. 15/697,658, dated Nov. 17, 2020, 7 pages.

Non-Final Office Action for U.S. Appl. No. 16/290,175, dated Jan. 6, 2021, 14 pages.

Non-Final Office Action for U.S. Appl. No. 16/358,823, dated Apr. 5, 2021, 12 pages.

Non-Final Office Action for U.S. Appl. No. 16/740,667, dated Mar. 4, 2021, 10 pages.

Non-Final Office Action for U.S. Appl. No. 16/776,738, dated Mar. 4, 2021, 7 pages.

Non-Final Office Action for U.S. Appl. No. 16/806,166, dated Mar. 18, 2021, 6 pages.

Notice of Allowance for U.S. Appl. No. 16/290,175, dated Jun. 14, 2021, 7 pages.

Corrected Notice of Allowability for U.S. Appl. No. 16/290,175, dated Jun. 23, 2021, 4 pages.

Notice of Allowance for U.S. Appl. No. 16/740,667, dated Jun. 11, 2021, 7 pages.

Notice of Allowance for U.S. Appl. No. 16/776,738, dated Jun. 11, 2021, 7 pages.

Notice of Allowance for U.S. Appl. No. 16/806,166, dated Jun. 18, 2021, 7 pages.

\* cited by examiner

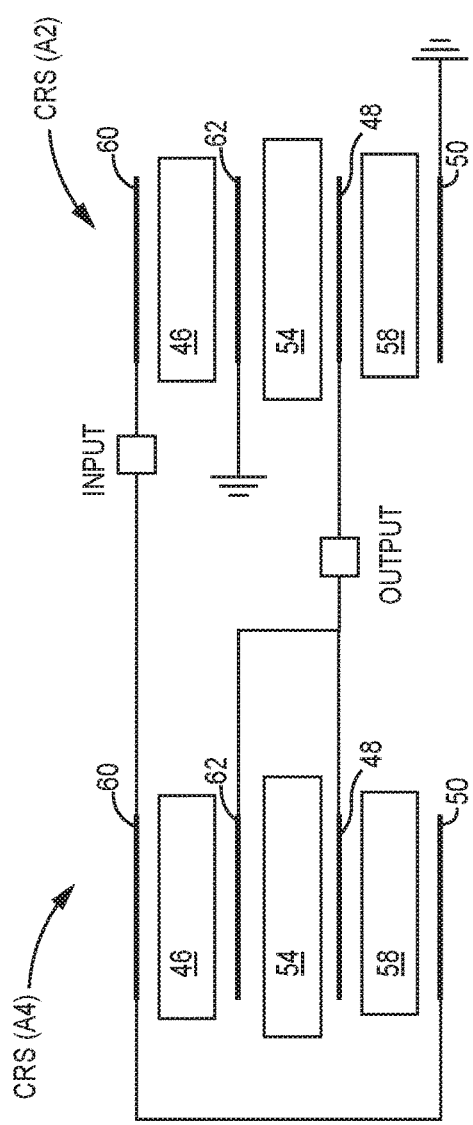
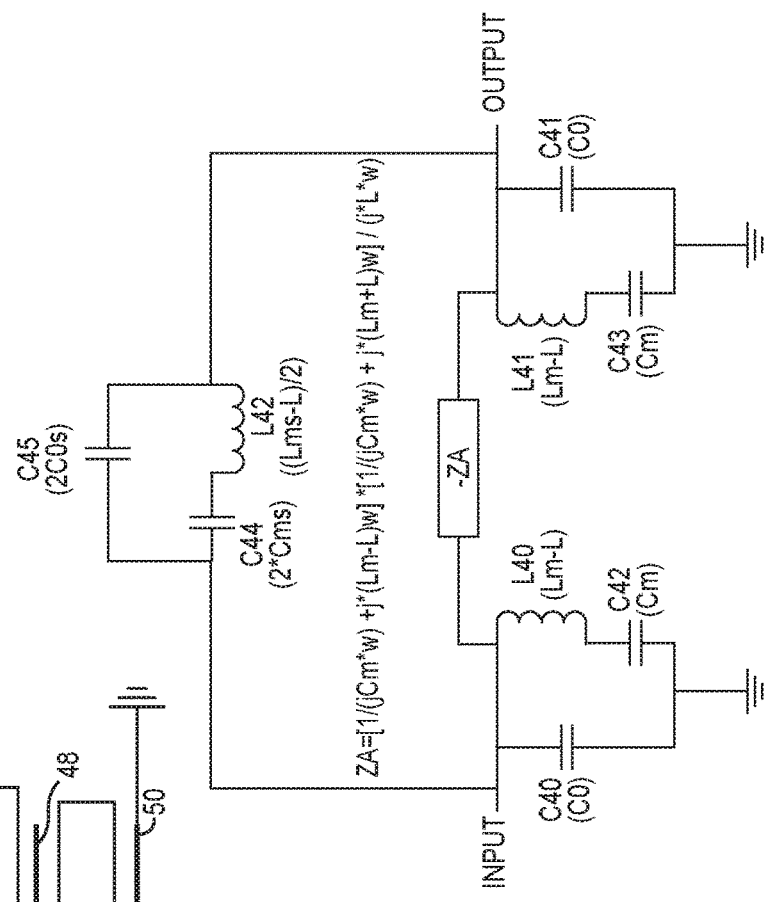
FIG. 35
FIG. 36

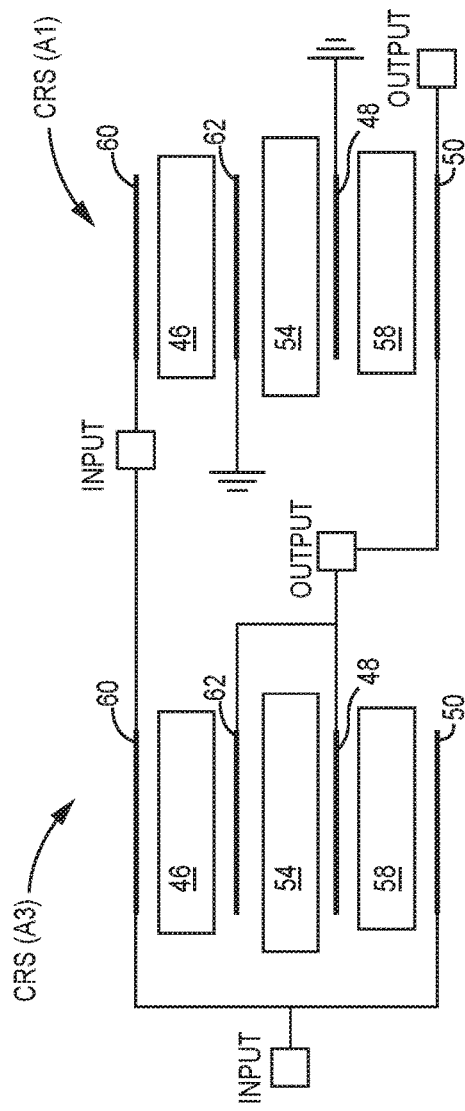
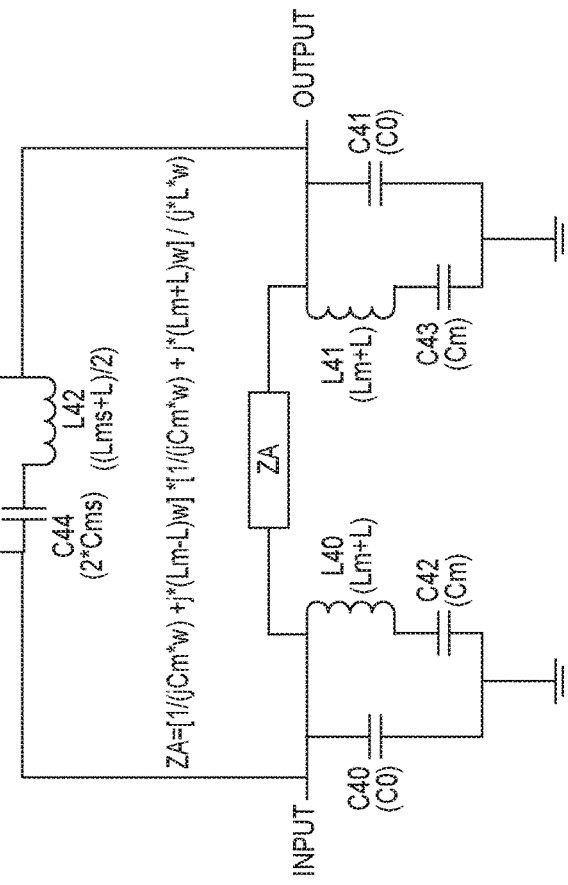
FIG. 37
FIG. 38

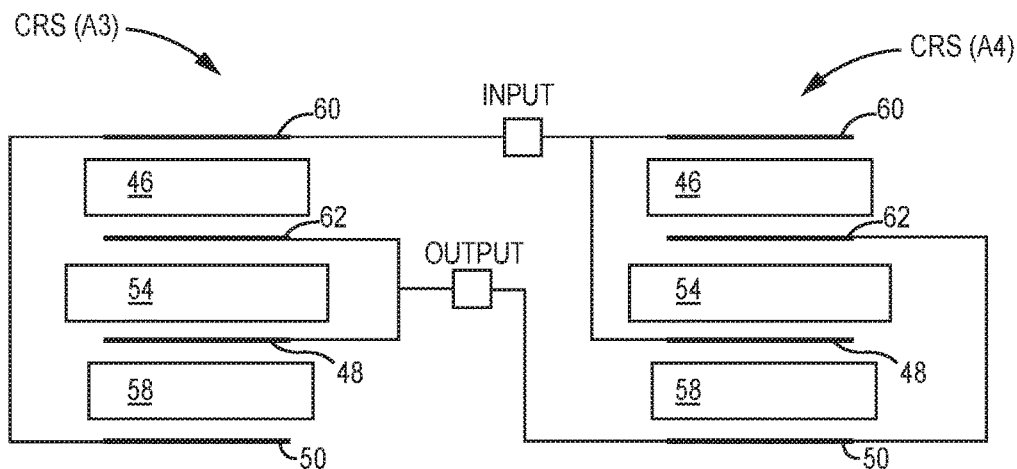
FIG. 41
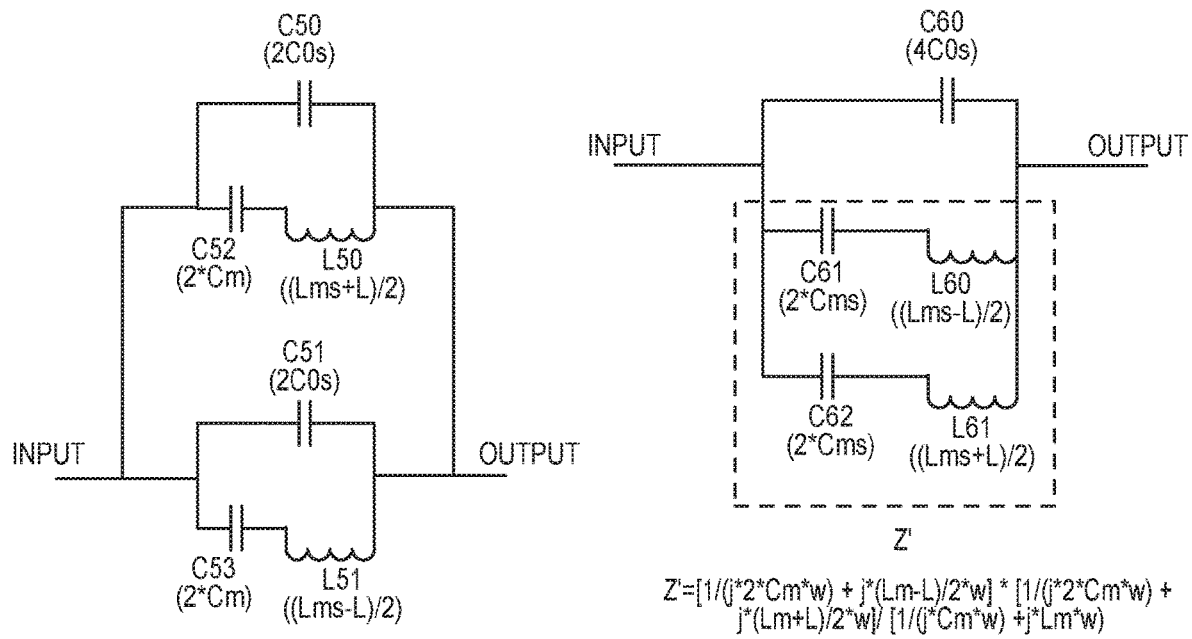
FIG. 42A
FIG. 42B

COUPLED RESONATOR STRUCTURE

RELATED APPLICATIONS

This application claims the benefit of provisional patent application Ser. No. 62/451,915, filed Jan. 30, 2017, the disclosure of which is hereby incorporated herein by reference in its entirety.

FIELD OF THE DISCLOSURE

The present disclosure relates to coupled resonator structures (CRSes).

BACKGROUND

Acoustic resonators, such as Surface Acoustic Wave (SAW) resonators and Bulk Acoustic Wave (BAW) resonators, are used in many high-frequency communication applications. In particular, SAW resonators are often employed in filter networks that operate frequencies up to 1.8 GHz, and BAW resonators are often employed in filter networks that operate at frequencies above 1.5 GHz. Such filters need to have flat passbands, have steep filter skirts and squared shoulders at the upper and lower ends of the passband, and provide excellent rejection outside of the passband. SAW- and BAW-based filters also have relatively low insertion loss, tend to decrease in size as the frequency of operation increases, and are relatively stable over wide temperature ranges.

As such, SAW- and BAW-based filters are the filter of choice for many 3rd Generation (3G) and 4th Generation (4G) wireless devices and are destined to dominate filter applications for 5th Generation (5G) wireless devices. Most of these wireless devices support cellular, wireless fidelity (Wi-Fi), Bluetooth, and/or near field communications on the same wireless device and, as such, pose extremely challenging filtering demands. While these demands keep raising the complexity of wireless devices, there is a constant need to improve the performance of acoustic resonators and filters that are based thereon.

To better understand acoustic resonators and various terminology associated therewith, the following provides an overview of a BAW resonator. However, the concepts described herein may employ any type of acoustic resonator and are not limited to SAW- and BAW-based resonators. An exemplary BAW resonator 10 is illustrated in FIG. 1. The BAW resonator 10 generally includes a substrate 12, a reflector 14 mounted over the substrate 12, and a transducer 16 mounted over the reflector 14. The transducer 16 rests on the reflector 14 and includes a piezoelectric layer 18, which is sandwiched between a top electrode 20 and a bottom electrode 22. The top and bottom electrodes 20 and 22 may be formed of Tungsten (W), Molybdenum (Mo), Platinum (Pt), or like material, and the piezoelectric layer 18 may be formed of Aluminum Nitride (AlN), Zinc Oxide (ZnO), or other appropriate piezoelectric material. Although shown in FIG. 1 as each including a single layer, the piezoelectric layer 18, the top electrode 20, and/or the bottom electrode 22 may include multiple layers of the same material, multiple layers in which at least two layers are different materials, or multiple layers in which each layer is a different material.

The BAW resonator 10 is divided into an active region 24 and an outside region 26. The active region 24 generally corresponds to the section of the BAW resonator 10 where the top and bottom electrodes 20 and 22 overlap and also includes the layers below the overlapping top and bottom electrodes 20 and 22. The outside region 26 corresponds to the section of the BAW resonator 10 that surrounds the active region 24.

For the BAW resonator 10, applying electrical signals across the top electrode 20 and the bottom electrode 22 excites acoustic waves in the piezoelectric layer 18. These acoustic waves primarily propagate vertically. A primary goal in BAW resonator design is to confine these vertically propagating acoustic waves in the transducer 16. Acoustic waves traveling upward are reflected back into the transducer 16 by the air-metal boundary at the top surface of the top electrode 20. Acoustic waves traveling downward are reflected back into the transducer 16 by the reflector 14 or by an air cavity, which is provided just below the transducer in a Film BAW Resonator (FBAR).

The reflector 14 is typically formed by a stack of reflector layers (RL) 28, which alternate in material composition to produce a significant reflection coefficient at the junction of adjacent reflector layers 28. Typically, the reflector layers 28 alternate between materials having high and low acoustic impedances, such as tungsten (W) and silicon dioxide ($SiO_2$). While only five reflector layers 28 are illustrated in FIG. 1, the number of reflector layers 28 and the structure of the reflector 14 varies from one design to another.

The magnitude (Z) and phase ($\phi$) of the electrical impedance as a function of the frequency for a relatively ideal BAW resonator 10 is provided in FIG. 2. The magnitude (Z) of the electrical impedance is illustrated by the solid line, whereas the phase ($\phi$) of the electrical impedance is illustrated by the dashed line. A unique feature of the BAW resonator 10 is that it has both a resonance frequency and an anti-resonance frequency. The resonance frequency is typically referred to as the series resonance frequency ($f_s$), and the anti-resonance frequency is typically referred to as the parallel resonance frequency ($f_p$). The series resonance frequency ($f_s$) occurs when the magnitude of the impedance, or reactance, of the BAW resonator 10 approaches zero. The parallel resonance frequency ($f_p$) occurs when the magnitude of the impedance, or reactance, of the BAW resonator 10 peaks at a significantly high level. In general, the series resonance frequency ($f_s$) is a function of the thickness of the piezoelectric layer 18 and the mass of the bottom and top electrodes 20 and 22.

For the phase, the BAW resonator 10 acts like an inductance that provides a 90° phase shift between the series resonance frequency ($f_s$) and the parallel resonance frequency ($f_p$). In contrast, the BAW resonator 10 acts like a capacitance that provides a −90° phase shift below the series resonance frequency ($f_s$) and above the parallel resonance frequency ($f_p$). The BAW resonator 10 presents a very low, near zero, resistance at the series resonance frequency ($f_s$) and a very high resistance at the parallel resonance frequency ($f_p$). The electrical nature of the BAW resonator 10 lends itself to the realization of a very high Q (quality factor) inductance over a relatively short range of frequencies, which has proven to be very beneficial in high-frequency filter networks, especially those operating at frequencies around 1.8 GHz and above.

Unfortunately, the phase ($\phi$) curve of FIG. 2 is representative of an ideal phase curve. In reality, approaching this ideal is challenging. A typical phase curve for the BAW resonator 10 of FIG. 1 is illustrated in FIG. 3A. Instead of being a smooth curve, the phase curve of FIG. 3A includes ripple below the series resonance frequency ($f_s$), between the series resonance frequency ($f_s$) and the parallel resonance frequency ($f_p$), and above the parallel resonance frequency ($f_p$). The ripple is the result of spurious modes, which are caused by spurious resonances that occur in corresponding frequencies. While the vast majority of the acoustic waves in the BAW resonator 10 propagate vertically, various boundary conditions about the transducer 16 result in the propagation of lateral (horizontal) acoustic waves, which are referred to as lateral standing waves. The presence of these lateral standing waves reduces the potential Q associated with the BAW resonator 10.

As illustrated in FIG. 4, a border (BO) ring 30 is formed on or within the top electrode 20 to suppress certain of the spurious modes. The spurious modes that are suppressed by the BO ring 30 are those above the series resonance frequency ($f_s$), as highlighted by circles A and B in the phase curve of FIG. 3B. Circle A shows a suppression of the ripple, and thus of the spurious mode, in the passband of the phase curve, which resides between the series resonance frequency ($f_s$) and the parallel resonance frequency ($f_p$). Circle B shows suppression of the ripple, and thus of the spurious modes, above the parallel resonance frequency ($f_p$). Notably, the spurious mode in the upper shoulder of the passband, which is just below the parallel resonance frequency $f_p$, and the spurious modes above the passband are suppressed, as evidenced by the smooth or substantially ripple free phase curve between the series resonance frequency ($f_s$) and the parallel resonance frequency ($f_p$) and above the parallel resonance frequency ($f_p$).

The BO ring 30 corresponds to a mass loading of the portion of the top electrode 20 that extends about the periphery of the active region 24. The BO ring 30 may correspond to a thickened portion of the top electrode 20 or the application of additional layers of an appropriate material over the top electrode 20. The portion of the BAW resonator 10 that includes and resides below the BO ring 30 is referred to as a BO region 32. Accordingly, the BO region 32 corresponds to an outer, perimeter portion of the active region 24 and resides inside of the active region 24.

While the BO ring 30 is effective at suppressing spurious modes above the series resonance frequency ($f_s$), the BO ring 30 has little or no impact on those spurious modes below the series resonance frequency ($f_s$), as shown by the ripples in the phase curve below the series resonance frequency ($f_s$) in FIG. 3B. A technique referred to as apodization is often used to suppress the spurious modes that fall below the series resonance frequency ($f_s$).

Apodization tries to avoid, or at least significantly reduce, any lateral symmetry in the BAW resonator 10, or at least in the transducer 16 thereof. The lateral symmetry corresponds to the footprint of the transducer 16, and avoiding the lateral symmetry corresponds to avoiding symmetry associated with the sides of the footprint. For example, one may choose a footprint that corresponds to a pentagon instead of a square or rectangle. Avoiding symmetry helps reduce the presence of lateral standing waves in the transducer 16. Circle C of FIG. 3C illustrates the effect of apodization in which the spurious modes below the series resonance frequency ($f_s$) are suppressed, as evidence by the smooth or substantially ripple free phase curve below the series resonance frequency ($f_s$). Assuming no BO ring 30 is provided, one can readily see in FIG. 3C that apodization fails to suppress those spurious modes above the series resonance frequency ($f_s$). As such, the typical BAW resonator 10 employs both apodization and the BO ring 30.

As noted previously, BAW resonators 10 are often used in filter networks that operate at high frequencies and require high Q values. A basic ladder network 40 is illustrated in FIG. 5A. The ladder network 40 includes two series resonators $B_{SER}$ and two shunt resonators $B_{SH}$, which are arranged in a traditional ladder configuration. Typically, the series resonators $B_{SER}$ have the same or similar first frequency response, and the shunt resonators $B_{SH}$ have the same or similar second frequency response, which is different from the first frequency response, as shown in FIG. 5B. In many applications, the shunt resonators $B_{SH}$ are detuned versions of the series resonators $B_{SER}$. As a result, the frequency responses for the series resonators $B_{SER}$ and the shunt resonators $B_{SH}$ are generally very similar, yet shifted relative to one another such that the parallel resonance frequency ($f_{p,SH}$) of the shunt resonators approximates the series resonance frequency ($f_{s,SER}$) of the series resonators $B_{SER}$. Note that the series resonance frequency ($f_{s,SH}$) of the shunt resonators $B_{SH}$ is less than the series resonance frequency ($f_{s,SER}$) of the series resonators $B_{SER}$. The parallel resonance frequency ($f_{p,SH}$) of the shunt resonators $B_{SH}$ is less than the parallel resonance frequency ($f_{p,SER}$) of the series resonators $B_{SER}$.

FIG. 5C is associated with FIG. 5B and illustrates the response of the ladder network 40. The series resonance frequency ($f_{s,SH}$) of the shunt resonators $B_{SH}$ corresponds to the low side of the passband's skirt (phase 2), and the parallel resonance frequency ($f_{p,SER}$) of the series resonators $B_{SER}$ corresponds to the high side of the passband's skirt (phase 4). The substantially aligned series resonance frequency ($f_{s,SER}$) of the series resonators $B_{SER}$ and the parallel resonance frequency ($f_{p,SH}$) of the shunt resonators $B_{SH}$ fall within the passband. FIGS. 6A through 6E provide circuit equivalents for the five phases of the response of the ladder network 40. During the first phase (phase 1, FIGS. 5C, 6A), the ladder network 40 functions to attenuate the input signal. As the series resonance frequency ($f_{s,SH}$) of the shunt resonators $B_{SH}$ is approached, the impedance of the shunt resonators $B_{SH}$ drops precipitously such that the shunt resonators $B_{SH}$ essentially provide a short to ground at the series resonance frequency ($f_{s,SH}$) of the shunt resonators (phase 2, FIGS. 5C, 6B). At the series resonance frequency ($f_{s,SH}$) of the shunt resonators $B_{SH}$ (phase 2), the input signal is essentially blocked from the output of the ladder network 40.

Between the series resonance frequency ($f_{s,SH}$) of the shunt resonators $B_{SH}$ and the parallel resonance frequency ($f_{p,SER}$) of the series resonators $B_{SER}$, which corresponds to the passband, the input signal is passed to the output with relatively little or no attenuation (phase 3, FIGS. 5C, 6C). Within the passband, the series resonators $B_{SER}$ present relatively low impedance, whereas the shunt resonators $B_{SH}$ present relatively high impedance, wherein the combination of the two leads to a flat passband with steep low- and high-side skirts. As the parallel resonance frequency ($f_{p,SER}$) of the series resonators $B_{SER}$ is approached, the impedance of the series resonators $B_{SER}$ becomes very high, such that the series resonators $B_{SER}$ essentially present themselves as open at the parallel resonance frequency ($f_{p,SER}$) of the series resonators (phase 4, FIGS. 5C, 6D). At the parallel resonance frequency ($f_{p,SER}$) of the series resonators $B_{SER}$ (phase 4), the input signal is again essentially blocked from the output of the ladder network 40.

During the final phase (phase 5, FIGS. 5C, 6E), the ladder network 40 functions to attenuate the input signal, in a similar fashion to that provided in phase 1. As the parallel resonance frequency ($f_{p,SER}$) of the series resonators $B_{SER}$ is passed, the impedance of the series resonators $B_{SER}$ decreases and the impedance of the shunt resonators $B_{SH}$ normalizes. Thus, the ladder network 40 functions to provide a high Q passband between the series resonance frequency ($f_{s,SH}$) of the shunt resonators $B_{SH}$ and the parallel resonance frequency ($f_{p,SER}$) of the series resonators $B_{SER}$.

The ladder network 40 provides extremely high attenuation at both the series resonance frequency ($f_{s,SH}$) of the shunt resonators $B_{SH}$ and the parallel resonance frequency ($f_{p,SER}$) of the series resonators. The ladder network 40 provides good attenuation below the series resonance frequency ($f_{s,SH}$) of the shunt resonators $B_{SH}$ and above the parallel resonance frequency ($f_{p,SER}$) of the series resonators $B_{SER}$. As noted previously, there is a constant need to improve the performance of acoustic resonators and filters that are based thereon.

In addition to being electrically coupled, the transducers 16 may be acoustically coupled to each other. An exemplary device in which transducers 16 are acoustically coupled to one another is referred to as a coupled resonator structure, CRS, which is illustrated in FIG. 7. The CRS is essentially a BAW device including two or more vertically stacked transducers, which are separated by an acoustic structure. As with the BAW resonator 10 of FIG. 1, the CRS has a substrate 42, a reflector 44, which includes multiple reflector layers 44L, and a bottom transducer 58. The bottom transducer 58 includes a top electrode 48, a bottom electrode 50, and a bottom piezoelectric layer 52 sandwiched therebetween. Unlike the BAW resonator 10 however, a coupling structure 54 is provided over the top electrode 48 of the bottom transducer 58. The coupling structure 54 includes multiple coupling layers 56, which are typically layers of alternating low and high acoustic impedances. A top transducer 46 is provided over the coupling structure 54 and includes a top electrode 60, a bottom electrode 62, and a top piezoelectric layer 64, which is sandwiched between the top electrode 60 and the bottom electrode 62.

The coupling structure 54 functions to acoustically couple the top transducer 46 and the bottom transducer 58 for one or more acoustic wavelengths or ranges thereof. While the materials may vary, a coupling structure 54 that includes three coupling layers 56 could include alternating layers of oxide, tungsten, and oxide, respectively. The coupling layers 56 may have thicknesses corresponding to one quarter of the acoustic wavelength for the frequency or frequencies of coupling. A reduced complexity block representation of the CRS is provided in FIG. 8, and is featured prominently in the unique implementations discussed below. For further information regarding the functionality and structure of the CRS, reference is made to Lakin, K. M., (2002), Coupled Resonator Filters, Proceedings of the IEEE Ultrasonics Symposium, 1, 901-908 vol. 1, 10.1109/ULTSYM.2002.1193543; Shirakawa, Alexandre & Thalhammer et al., (2011), Bulk Acoustic Wave-Coupled Resonator Filters: Concept, Design, and Application, International Journal of RF and Microwave Computer-Aided Engineering, 21, 477-485, 10.1002/mmce.20552; and U.S. Pat. No. 6,720,844, which are incorporated herein by reference in their entireties.

SUMMARY

Various arrangements for electrically coupling the electrodes of coupled resonator structures (CRSes) to form unique two- and three-terminal devices as well as the use of such CRSes are disclosed.

In one embodiment, a device includes a network input, a network output, and a filter network coupled between the network input and the network output. The filter network comprises a plurality of coupled resonator structures that are electrically coupled together. Each coupled resonator structure (CRS) includes a substrate, a bottom transducer over the substrate, a first acoustic coupling structure over the bottom transducer, and a top transducer over the first acoustic coupling structure. The bottom transducer has a first bottom electrode over the substrate, a first piezoelectric layer over the first bottom electrode, and a first top electrode over the first piezoelectric layer. The top transducer has a second bottom electrode, a second piezoelectric layer over the second bottom electrode, and a second top electrode over the second piezoelectric layer, wherein the bottom transducer is vertically acoustically coupled to the top transducer via the first acoustic coupling structure.

An arrangement of a first CRS of the plurality of CRSes is one of a first arrangement, a second arrangement, a third arrangement, and a fourth arrangement, and an arrangement of a second CRS of the plurality of CRSes is a different one of the first arrangement, the second arrangement, the third arrangement, and the fourth arrangement. In the first arrangement, the second top electrode is a first terminal, the first bottom electrode is a second terminal, and the first top electrode is directly electrically coupled to the second bottom electrode to provide a third terminal of a first three terminal device. In the second arrangement, the second top electrode is a fourth terminal, the first top electrode is a fifth terminal, and the first bottom electrode is directly electrically coupled to the second bottom electrode to provide a sixth terminal of a second three terminal device.

In the third arrangement, the first bottom electrode is directly electrically coupled to the second top electrode to provide a seventh terminal and the first top electrode is directly electrically coupled to the second bottom electrode to provide an eighth terminal of a first two terminal device. In the fourth arrangement, the first bottom electrode is directly electrically coupled to the second bottom electrode to provide a ninth terminal and the first top electrode is directly electrically coupled to the second top electrode to provide a tenth terminal of a second two terminal device.

While any combination of arrangements are possible and duplicate arrangements may be employed in a given filter network, non-limiting arrangement combinations include the following: the first CRS has the first arrangement, and the second CRS has the second arrangement; the first CRS has the first arrangement, and the second CRS has the third arrangement; the first CRS has the first arrangement, and the second CRS has the fourth arrangement; the first CRS has the second arrangement, and the second CRS has the third arrangement; the first CRS has the second arrangement, and the second CRS has the fourth arrangement; the first CRS has the third arrangement, and the second CRS has the fourth arrangement.

In one embodiment, the top transducer of the first CRS is structurally identical to the top transducer of the second CRS, and the bottom transducer of the first CRS is structurally identical to the bottom transducer of the second CRS. In this embodiment, first CRS may have a first series resonance frequency, and the second CRS may have a second series resonance frequency that is different than the first series resonance frequency.

The plurality of CRSes may be electrically coupled together to form a ladder network, wherein the term electrically coupled is defined to mean that intervening components and/or devices may electrically reside between the electrically coupled elements. Directly electrically coupled is defined to mean that there are no components and/or devices residing between the coupled elements, except for the electrical wires, traces, vias, and the like that are used to connect the coupled elements. The first CRS may a shunt element of the ladder network, and the second CRS may be a series element of the ladder network.

Further, an arrangement of a third CRS of the plurality of CRSes may a different one of the first arrangement, the second arrangement, the third arrangement, and the fourth arrangement than the arrangement of the first CRS and the arrangement of the second CRS. For example, the arrangement of the first CRS of the plurality of CRSes may be the first arrangement, the arrangement of the second CRS of the plurality of CRSes may be the second arrangement, an arrangement of a third CRS of the plurality of CRSes may be the third arrangement, and an arrangement of the fourth CRS of the plurality of CRSes may be the fourth arrangement. The filter network, regardless of configuration, may further include BAW resonators, passive components, active components, and the like. In one embodiment, the first CRS has a first series resonance frequency, the second CRS has a second series resonance frequency that is different than the first series resonance frequency, and the at least one BAW resonator has a third series resonance frequency that is different than the first and second series resonance frequencies.

In another embodiment, a CRS includes a substrate, a bottom transducer over the substrate, a first acoustic coupling structure over the bottom transducer, and a top transducer over the first acoustic coupling structure. The bottom transducer has a first bottom electrode over the substrate, a first piezoelectric layer over the first bottom electrode, and a first top electrode over the first piezoelectric layer. The top transducer has a second bottom electrode, a second piezoelectric layer over the second bottom electrode, and a second top electrode over the second piezoelectric layer, wherein the bottom transducer is acoustically coupled to the top transducer, the first top electrode is directly electrically coupled to the second top electrode, and the first bottom electrode is directly electrically coupled to the second bottom electrode.

In one embodiment, the series resonance frequency of the top transducer is about the same as the series resonance frequency of the bottom transducer.

In another embodiment, the series resonance frequency of the top transducer is different from the series resonance frequency of the bottom transducer. In yet another embodiment, the top transducer is aligned directly over the bottom transducer.

In another embodiment, the bottom transducer is acoustically coupled to the top transducer, the first top electrode is directly electrically coupled to the second bottom electrode, and the first bottom electrode is directly electrically coupled to the second top electrode.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

The accompanying drawing figures incorporated in and forming a part of this specification illustrate several aspects of the disclosure and, together with the description, serve to explain the principles of the disclosure.

FIG. 35 is a sixth filter network embodiment.

FIG. 36 is an electrical equivalent of the third filter network embodiment of FIG. 35.

FIG. 37 is a seventh filter network embodiment.

FIG. 38 is an electrical equivalent of the third filter network embodiment of FIG. 37.

FIG. 41 is a twelfth filter network embodiment.

FIGS. 42A and 42B are electrical equivalents of the twelfth filter network embodiment of FIG. 41.

DETAILED DESCRIPTION

Figure 1:
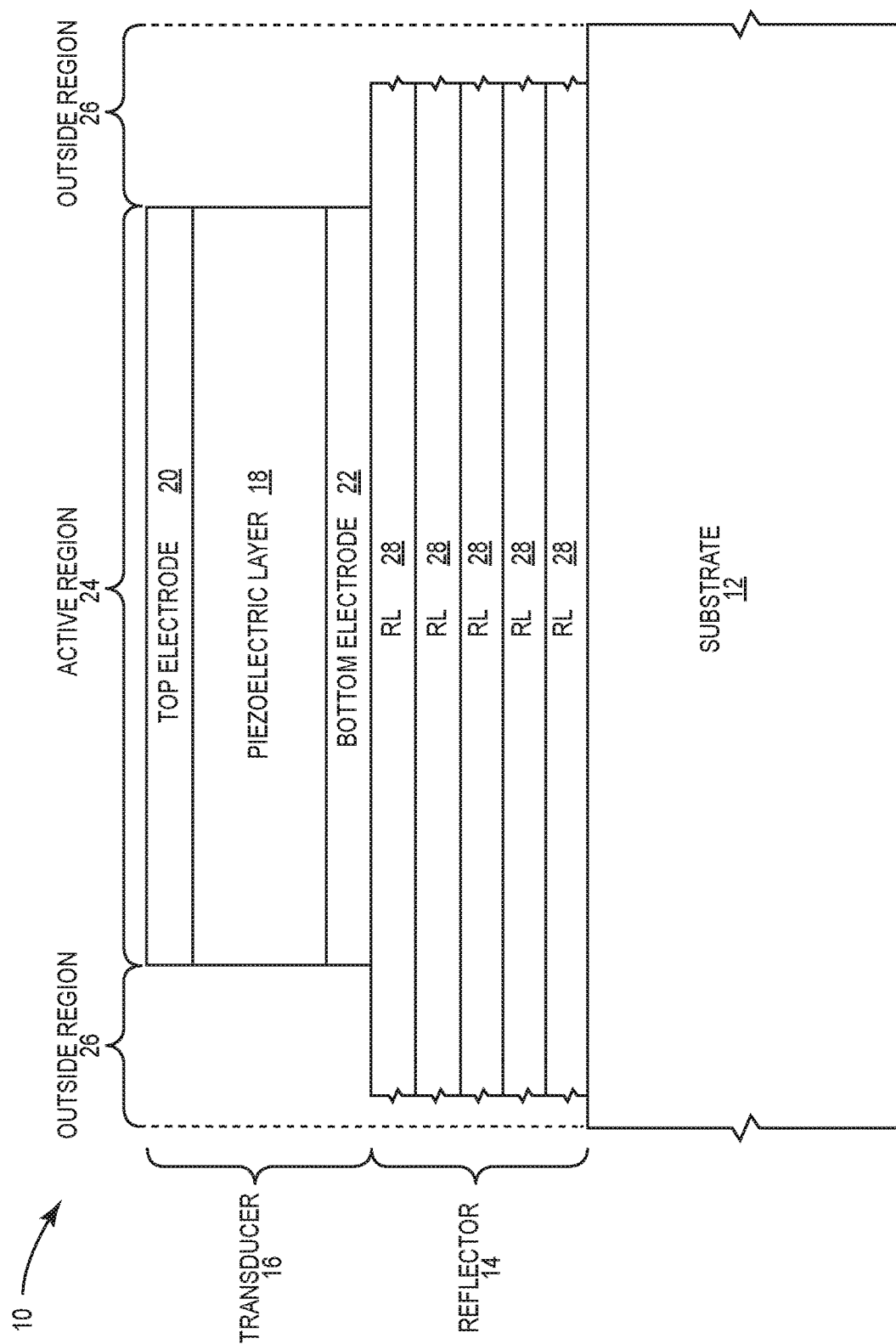
FIG. 1 illustrates a conventional Bulk Acoustic Wave (BAW) resonator.
Figure 2:
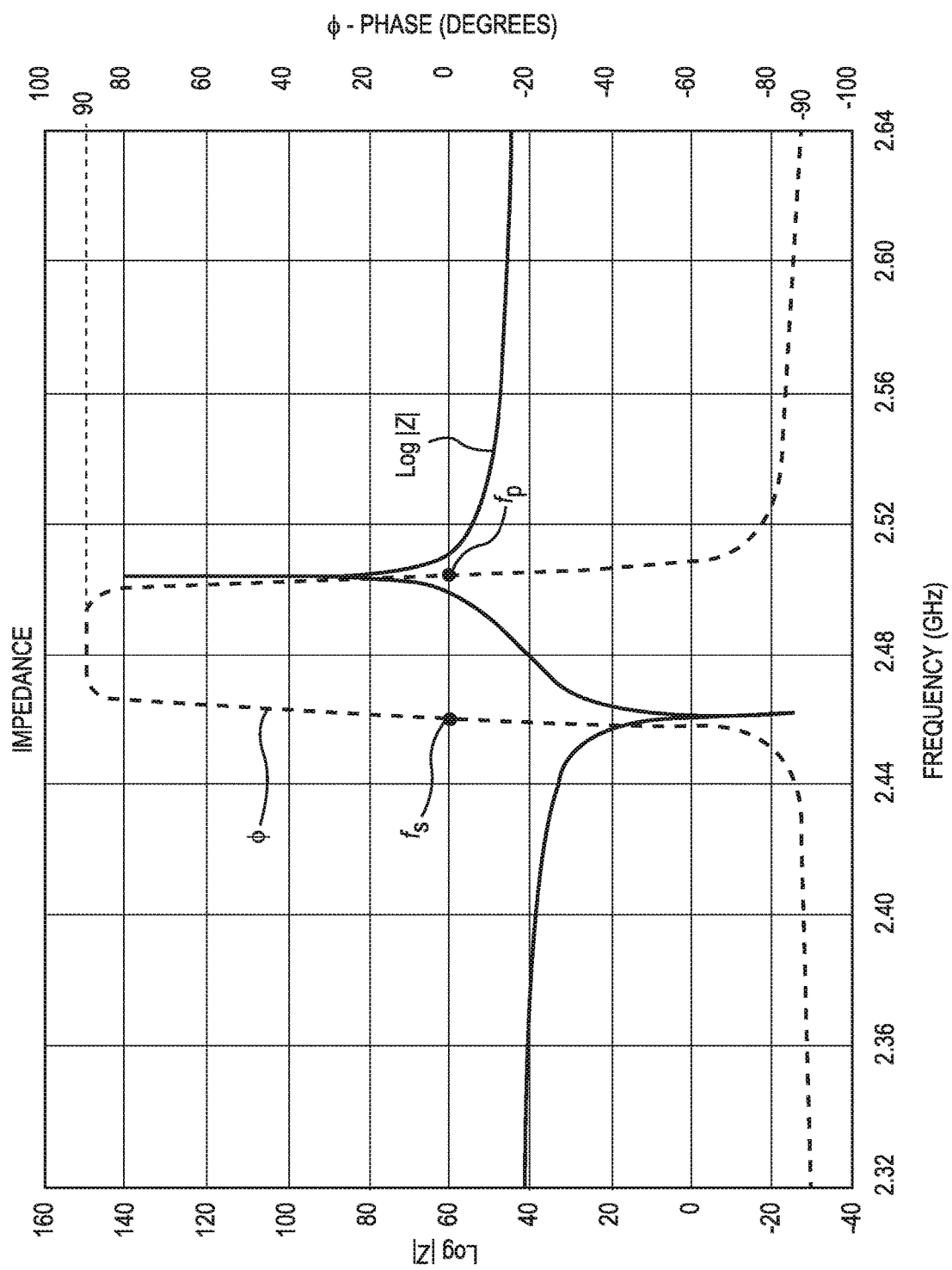
FIG. 2 is a graph of the magnitude and phase of impedance over frequency responses as a function of frequency for an ideal BAW resonator.
Figure 3:
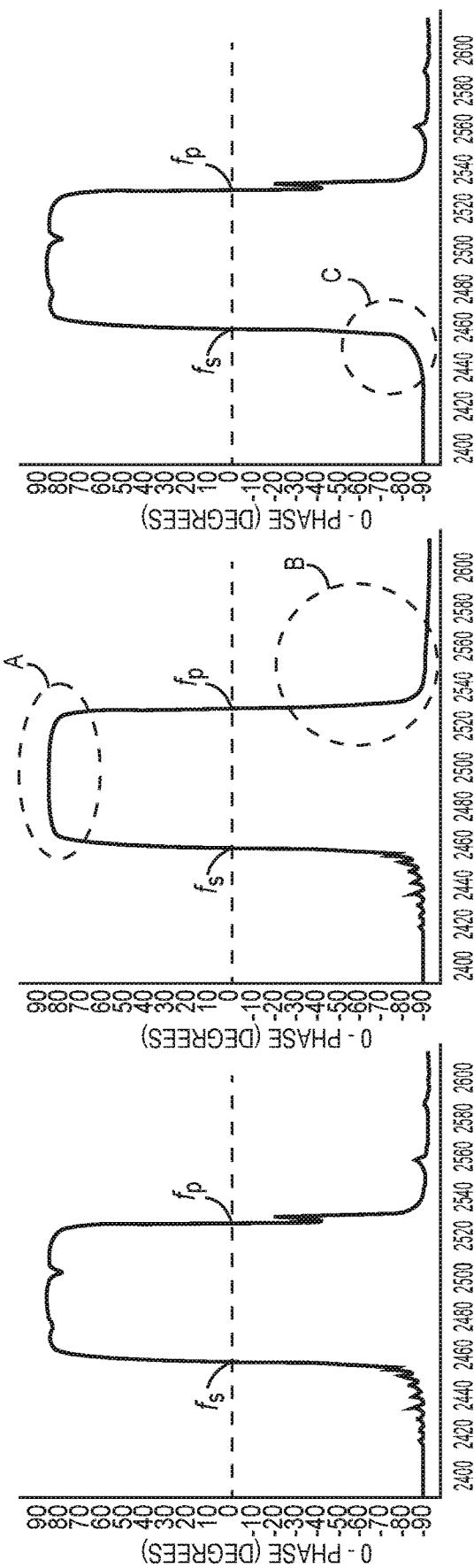
FIGS. 3A-3C are graphs of phase responses for various BAW resonator configurations.
Figure 4:
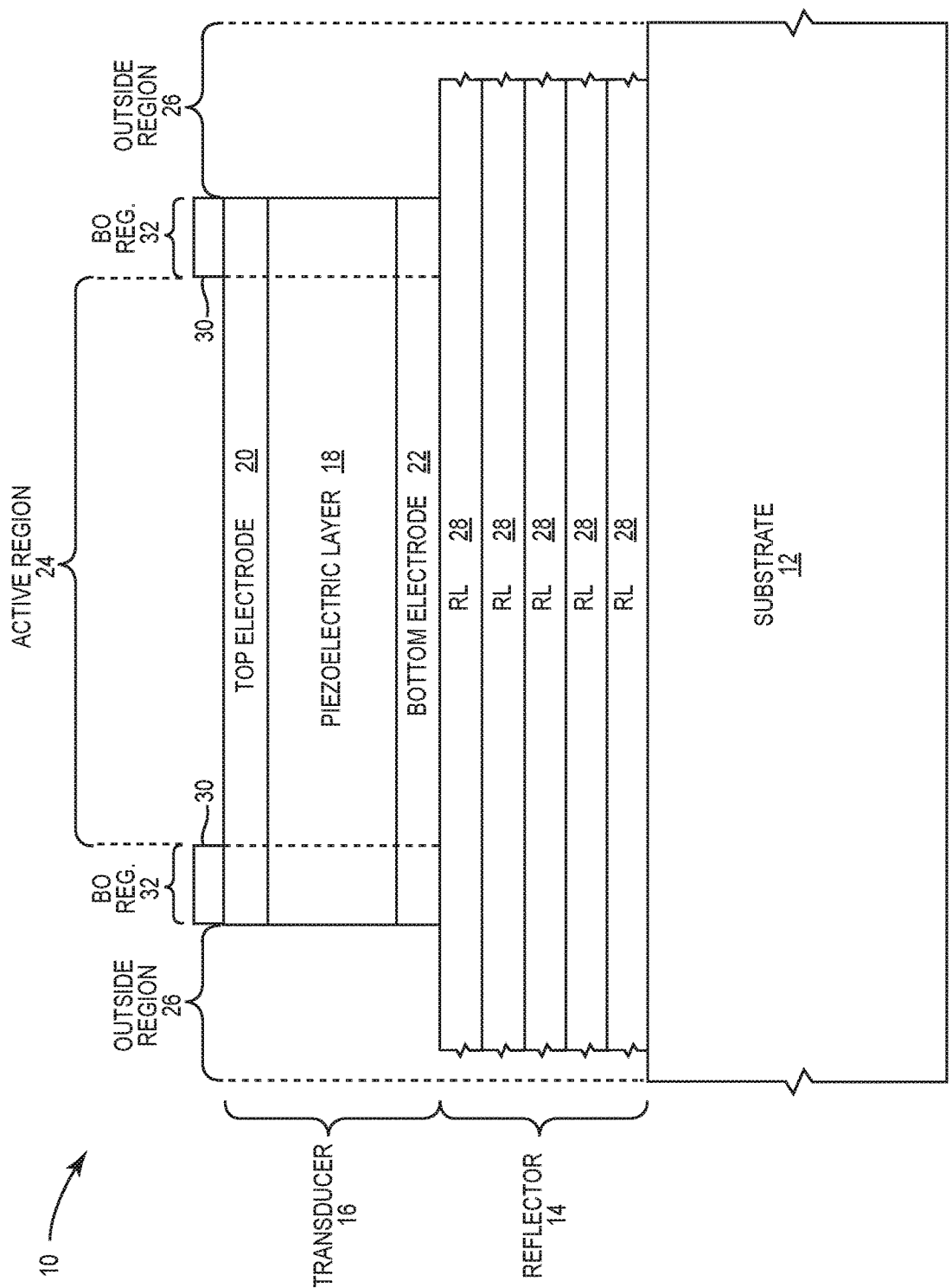
FIG. 4 illustrates a conventional BAW resonator with a border ring.
Figure 5A:
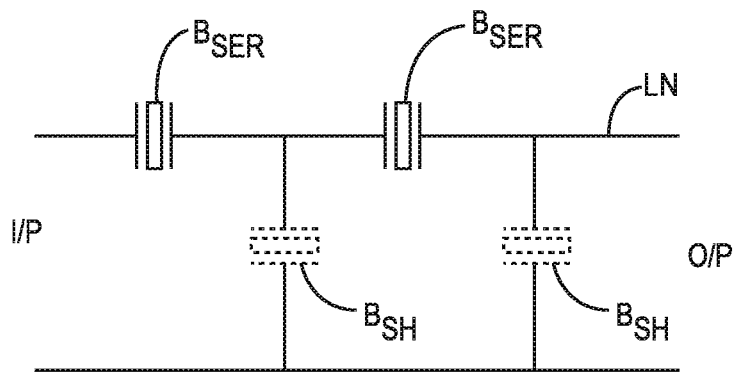
FIG. 5A is a schematic of a conventional ladder network.
Figure 5B:
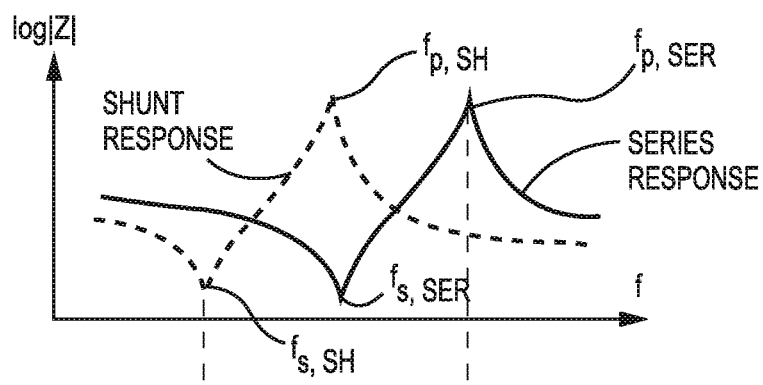
FIGS. 5B and 5C are graphs of a frequency response for BAW resonators in the conventional ladder network of FIG. 5A and a frequency response for the conventional ladder network of FIG. 5A.
Figure 5C:
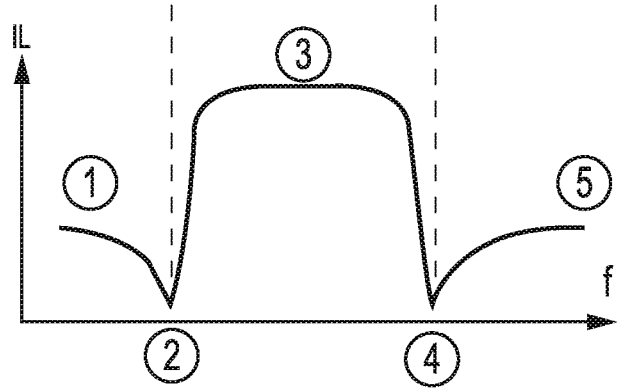
Figure 6A:
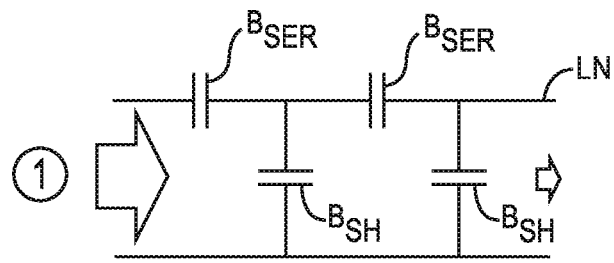
FIGS. 6A-6E are circuit equivalents for the ladder network of FIG. 5A at the frequency points 1, 2, 3, 4, and 5, which are identified in FIG. 5C.
Figure 6B:
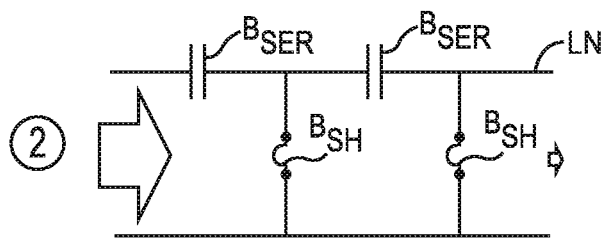
Figure 6C:
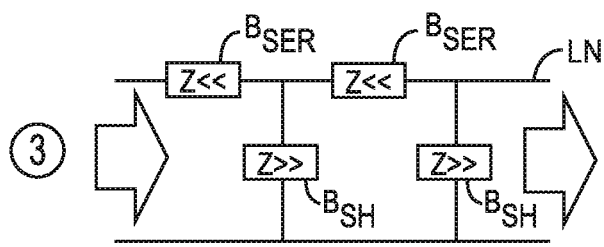
Figure 6D:
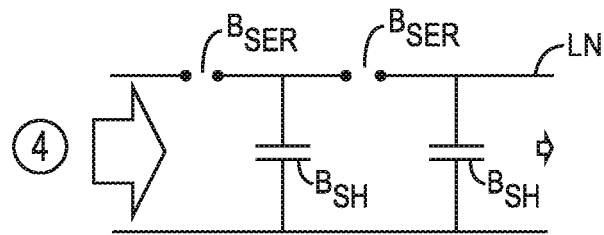
Figure 6E:
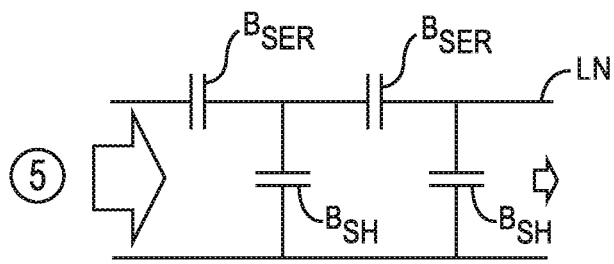
Figure 7:
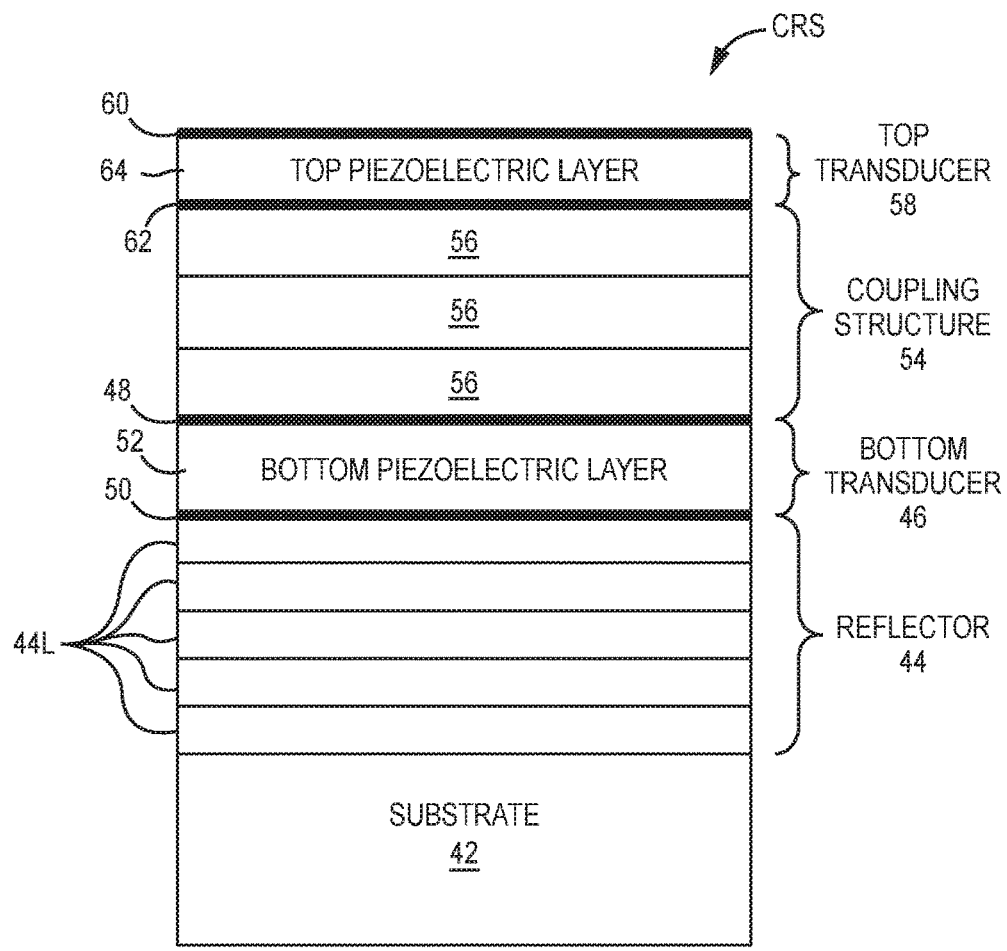
FIG. 7 is a cross-section of a coupled resonator structure (CRS), according to one embodiment.
Figure 8:
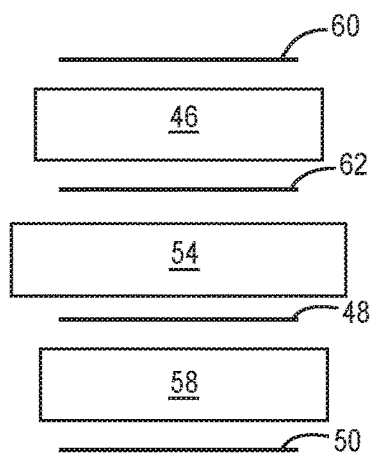
FIG. 8 is a simplified symbolic representation of the CRS of FIG. 7.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the figures. It will be understood that these terms and those discussed previously are intended to encompass different orientations of the device in addition to the orientation depicted in the figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

As defined herein, the term "coupled" without being preceded with the adjective "acoustically" refers to an electrical coupling as opposed to an acoustic coupling. The term "acoustically coupled" refers to an acoustic coupling as opposed to an electrical coupling. Further, the phrase "about the same as" when referring to the series resonance frequency of two or more devices means that the series resonance frequencies of the devices are within 0.1% of each other.

While the concepts provided herein are applicable to various technologies, these concepts are particularly useful in mobile terminals, such as mobile telephones, tablets, computers, and like smart devices. The following provides an overview of such devices. Today's mobile terminals must communicate using different communication technologies in different bands, which vary significantly in both bandwidth and frequency. To further complicate matters, data rates are ever increasing and the there is a need to transmit and receive over these different bands at the same time. As a result, mobile terminals have very complicated front-end configurations and are starting to employ multiple input multiple output (MIMO) transmission and reception technology, which requires the use of multiple antennas.

Figure 9:
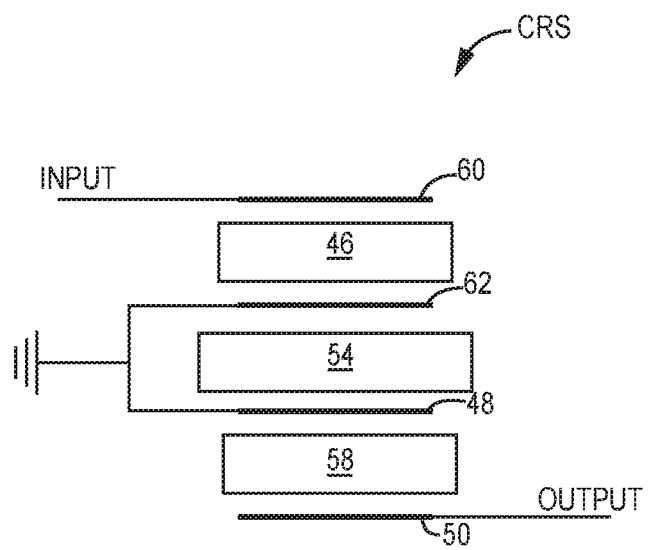
FIG. 9 is a first CRS arrangement.

The concepts described below relate to different arrangements for electrically coupling the top and bottom transducers 58, 46 of a CRS, wherein the different arrangements correspond to different impedance behaviors over frequency. These arrangements afford designers tremendous flexibility in filter design. A first arrangement is illustrated in FIG. 9. An input is coupled to the top electrode 60 of the top transducer 46, and an output is coupled to a bottom electrode 50 of the bottom transducer 58. The bottom electrode 62 of the top transducer 46 and the top electrode 48 of the bottom transducer 58 are coupled to ground, or other fixed voltage node.

Figure 10:
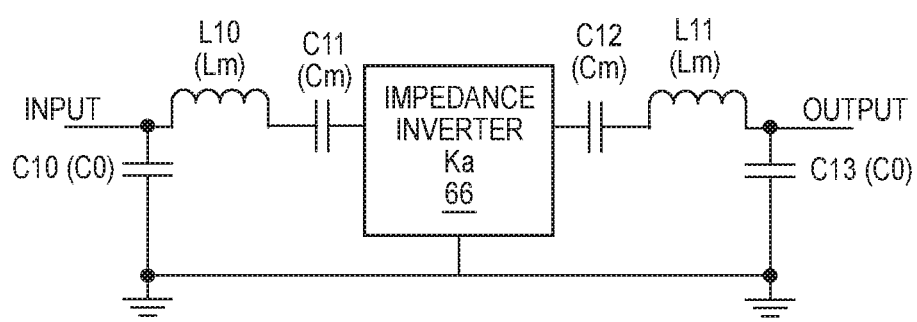
FIG. 10 is an electrical equivalent of the CRS of FIG. 9.

An electrical model of this arrangement is illustrated in FIG. 10. Two capacitors C0 are coupled between the input and ground, and the output and ground, respectively. The coupling structure 54 is represented by an impedance inverter 66 with an acoustic coupling coefficient Ka. A first series LC circuit is coupled between the input and the impedance inverter 66, and a second LC circuit is coupled between the impedance inverter 66 and the output. The impedance inverter 66 is also coupled to ground. Each LC circuit includes a series coupled inductor Ln, which has a value of Ln, and a capacitor Cn, which has a value of Cn. For FIGS. 10, C10 and C13 have a capacitance of C0, capacitors C11 and C12 have a capacitance of Cm, and inductors L10 and L11 have an inductance of Lm.

Figure 11:
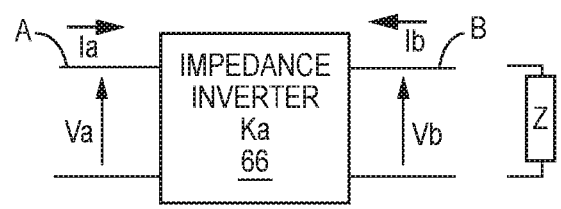
FIG. 11 is a model of an impedance inverter.

As illustrated in FIG. 11, a model of the impedance inverter 66 will have input and output voltages Va, Vb, respectively, and input and output currents Ia and Ib, respectively. If an impedance Z is connected to port B, the impedance Zinv seen on port A is equal to $Ka^2/Z$ ($Zinv=Ka^2/Z$).

Figure 12:
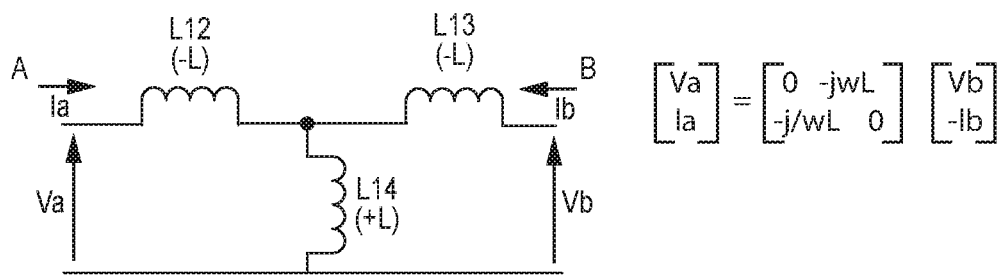
FIG. 12 is a T-model of an impedance inverter.

FIG. 12 illustrates an exemplary electrical network that acts as an impedance inverter. The network is effectively a T network with three inductors, wherein the series connected inductors are coupled between port A and port B and have a value of −L. An inductor that has a value of +L is coupled and shown between the node where the series connected inductors are coupled in ground. With this configuration, the following holds true:

$$\begin{bmatrix} Va \\ Ia \end{bmatrix} = \begin{bmatrix} 0 & -jwL \\ -j/wL & 0 \end{bmatrix} \begin{bmatrix} Vb \\ -Ib \end{bmatrix}$$

$Va = +j*w*L*Ib;$ $Vb = +j*w*L*Ia;$ $Vb = -Z*Ib$ where $Z$ is the load impedance tied to node $B$; and $Va/Ia = Zinv = +(L*w)^2/Z.$ For FIG. 12, L12 and L13 have inductance values of −L, while inductor L14 has an inductance of +L.

Figure 13:
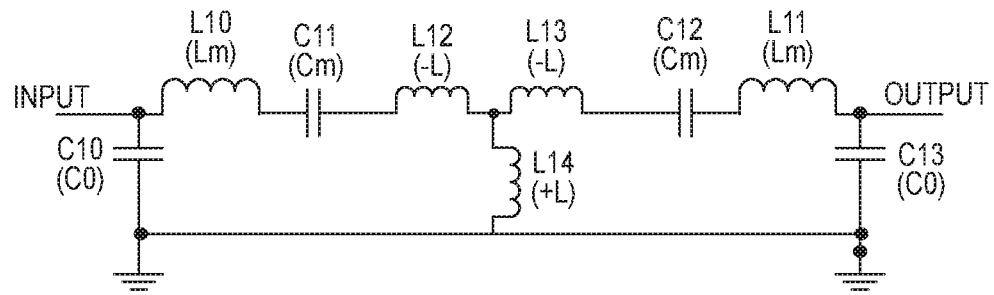
FIG. 13 is an electrical equivalent with the T-model for the impedance inverter of the CRS of FIG. 9.
Figure 14:
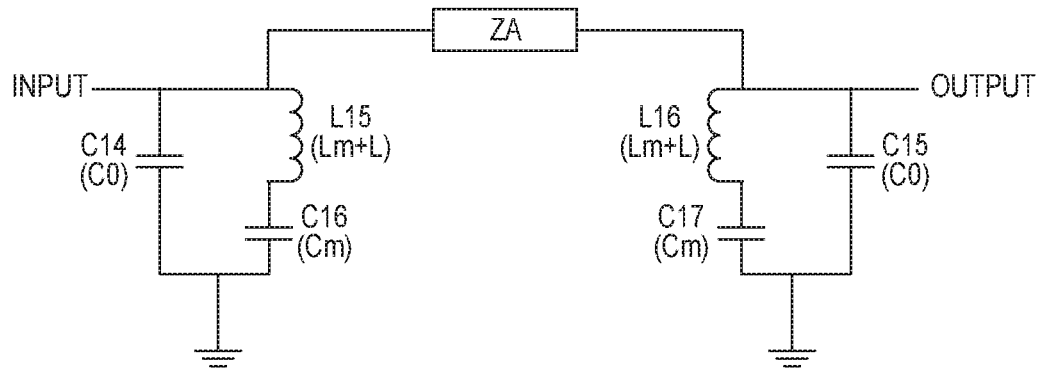
FIG. 14 is a pi-equivalent of the electrical equivalent of FIG. 13.

Since $Zinv^2 = Ka^2/Z$, $Ka = L*w$, where w is $2*\pi*f$, where f is frequency. FIG. 13 shows the electrical equivalent of the CRS using the electrical equivalent of the impedance inverter 66. Notably, FIG. 13 is effectively a T-type electrical equivalent. FIG. 14 represents a pi-type electrical equivalent of the electrical equivalent of FIG. 13. For FIGS. 14, L15 and L16 have inductances of Lm+L, capacitors C14 and C15 have capacitances of C0, and capacitors C16 and C17 have capacitances of Cm.

Figure 15:
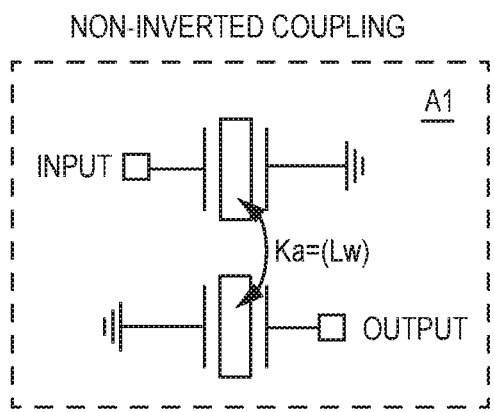
FIG. 15 is a symbol for the CRS arrangement of FIG. 9.
Figure 16:
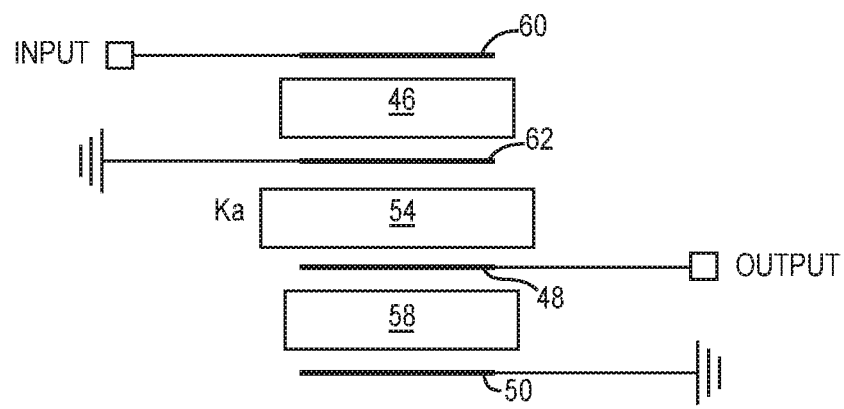
FIG. 16 is a second CRS arrangement.

The pi-type electrical equivalent includes a series impedance ZA that extends between the input that output, an input shunt element coupled between the input and ground, and an output shunt element coupled between the output and ground. Each of the input and output shunt elements are made of an impedance Zs wherein Zm+j*Lw is in parallel with a capacitance C0. Each shunt impedance Zs is equivalent to that of a shunt resonator that has a series resonance frequency, fs, occurring at $1/(2*\pi*\sqrt{((Lm+L)*Cm)})$. Notably, the series resonance frequency, fs, for the shunt impedance Zs is based on the Lm+L inductance, where L is the coupling equivalent inductance based on Ka=Lw. The series impedance ZA between the input and output is such that ZA=(Zm+j*L*w)*(Zm−j*L*w)/(j*L*w)=(Zm²+(L*w)²)/(j*L*w), where Zm=1/(j*Cm*w)+j*Lm*w. A symbol for the CRS arrangement A1 of FIG. 9 is provided in FIG. 15. CRS arrangement A1 is a non-inverted coupling arrangement. The next arrangement, CRS arrangement A2, which is illustrated in FIG. 16, is an inverted coupling arrangement.

Figure 17:
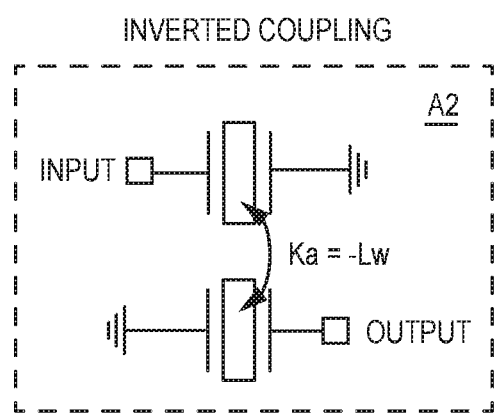
FIG. 17 is a symbol for the second CRS arrangement.
Figure 18:
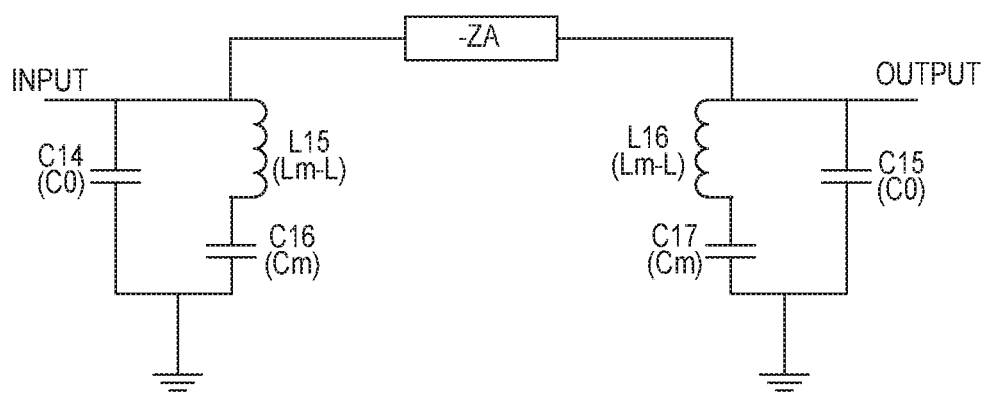
FIG. 18 is an electrical equivalent of the second CRS arrangement.

CRS arrangement A2 is the same as that of FIG. 9, with the exception that the top electrode 48 of the bottom transducer 58 is coupled to the output (instead of ground), and the bottom electrode 50 of the bottom transducer 58 is coupled to ground (instead of the output). A symbol for the CRS arrangement A2 is illustrated in FIG. 17, and a pi-type electrical equivalent of the CRS arrangement is illustrated in FIG. 18. Notably, the impedance structure is substantially the same as that illustrated in FIG. 14, with the exception that the shunt inductors have a value of Lm−L and the series impedance ZA is negative due to the inversion of the electrical coupling of the top and bottom electrodes 48, 50 of the bottom transducer 58. In essence, swapping the electrical connections for the top and bottom electrodes 48, 50 of the bottom transducer 58 inverts the impedance ZA, which is mathematically represented as making the impedance ZA negative. A similar effect is provided for the coupling equivalent inductance L. As a result, the inductance values for the shunt elements are Lm−L (instead of Lm+L, as provided in CRS arrangement A1 of FIG. 14). For FIGS. 18, L15 and L16 have inductances of Lm−L, capacitors C14 and C15 have capacitances of C0, and capacitors C16 and C17 have capacitances of Cm.

As a result, the shunt impedance at both the input and output for CRS arrangement A2 is Zm−j*Lw in parallel with C0m, which again is an equivalent impedance of a shunt acoustic resonator that has a series resonance frequency at $1/(2*\pi*\sqrt{((Lm-L)*Cm)})$. Notably, the series resonance frequency is now based on Lm−L (instead of Lm+L, as provided in the CRS arrangement A1), where L is the coupling equivalent inductance based on Ka=−Lw (i.e. negative coupling with corresponds to an electrical inversion of phase). Accordingly, swapping the connections for the top and bottom electrodes 48, 50 of the bottom transducer 58 for a CRS, without changing any physical characteristics, such as size, shape, material compositions, layer thicknesses, and the like, changes the series resonance frequency between $1/(2*\pi*\sqrt{((Lm-L)*Cm)})$ and $1/(2*\pi*\sqrt{((Lm+L)*Cm)})$. Being able to choose different series resonance frequencies for the same CRS configuration provides designers greater flexibility in circuit and layout design, especially when designing ladder or like filter networks with CRS and other BAW resonators 10.

The above CRS arrangements A1 and A2 are effectively three terminal devices, which include an input, and output, and ground terminals. The following embodiments employ the concepts described above in a two terminal configuration, which has an input terminal and an output terminal, wherein there is a virtual ground provided in the coupling structure 54.

Figure 19:
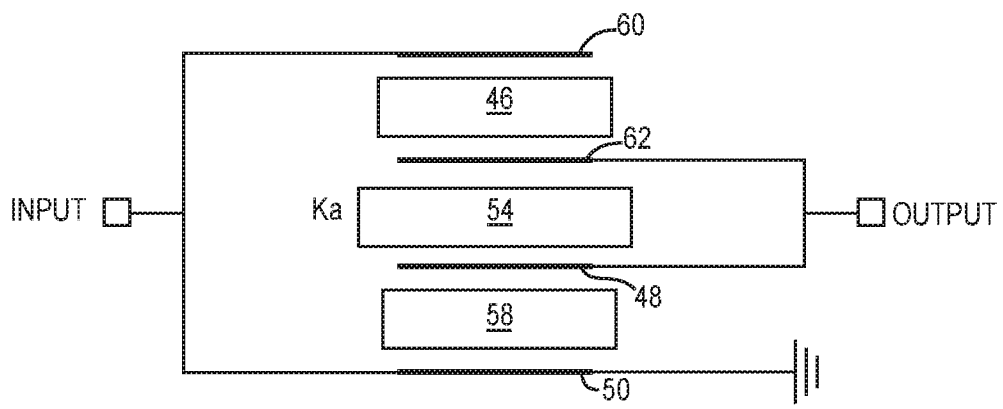
FIG. 19 is a third CRS arrangement.
Figure 20:
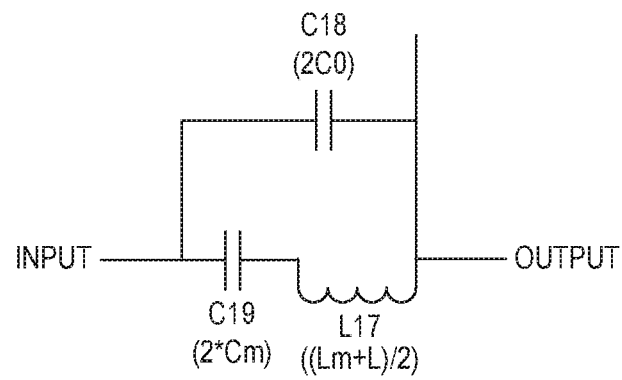
FIG. 20 is a symbol for the third CRS arrangement.

FIG. 19 illustrates a third CRS arrangement A3, wherein the top electrode 60 of the top transducer 46 and the bottom electrode 50 of the bottom transducer 58 are coupled to the input. The bottom electrode 62 of the top transducer 46 and the top electrode 48 of the bottom transducer 58 are coupled to the output. The equivalent impedance is illustrated in FIG. 20. For FIG. 20, capacitor C18 has a capacitance of 2C0, capacitor C19 has a capacitance of 2Cn, and inductor L17 has an inductance of (Lm+L)/2.

Figure 21:
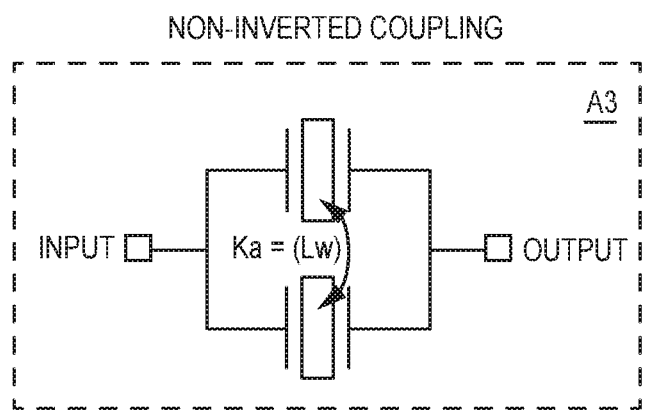
FIG. 21 is an electrical equivalent of the third CRS arrangement.

This equivalent impedance of CRS arrangement A3 has a series resonance frequency at $1/(2*\pi*\sqrt{((Lm+L)*Cm)})$, which is made of an equivalent inductance of (Lm+L)/2. This is considered a non-inverted coupling configuration with an acoustic coupling coefficient of +Ka. A standard BAW resonator 10 that corresponds in shape, size, and materials to the one of the top or bottom transducers 46, 58 would have a series resonance frequency at $1/(2*\pi*\sqrt{((Lm)*Cm)})$. The equivalent impedance of the CRS arrangement A3 is effectively that of a capacitance of 2C0 in parallel with a series coupled inductance of (Lm+L)/2 and a capacitance of 2*Cm. A symbol for the CRS arrangement A3 of FIG. 19 is provided in FIG. 21.

Figure 22:
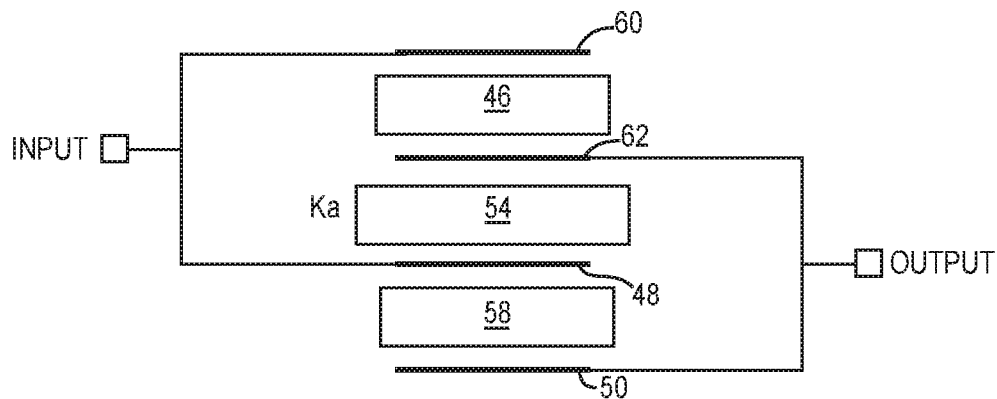
FIG. 22 is a fourth CRS arrangement.
Figure 23:
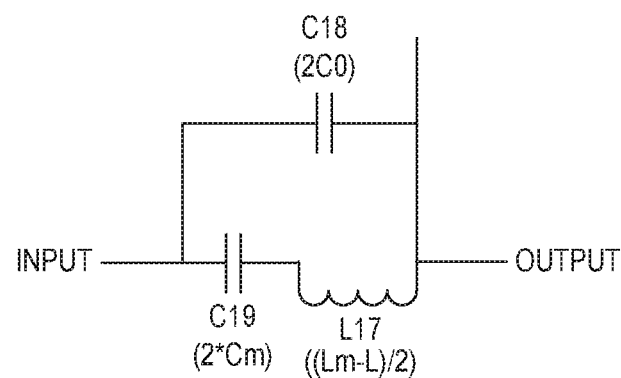
FIG. 23 is a symbol for the fourth CRS arrangement.

A fourth CRS arrangement A4 is illustrated in FIG. 22. CRS arrangement A4 is an inverting variant of the CRS arrangement A3 of FIG. 19. In particular, the top electrode 60 of the top transducer 46 and the top electrode 48 of the bottom transducer 58 are coupled to the input. The bottom electrode 62 of the top transducer 46 and the bottom electrode 50 of the bottom transducer 58 are coupled to the output to provide a two terminal device that has an equivalent impedance illustrated in FIG. 23. For FIG. 23, capacitor C18 has a capacitance of 2C0 capacitor C19 has a capacitance of 2*Cm, and inductor L17 has an inductance of (Lm−L)/2.

The equivalent impedance of CRS arrangement A4 has a series resonance frequency at $1/(2*\pi*\sqrt{((Lm-L)*Cm)})$, which is made of an equivalent inductance of (Lm−L)/2. As noted, this is considered an inverted coupling arrangement with an acoustic coupling coefficient of −Ka. A standard BAW resonator 10 that corresponds in shape, size, and materials to the one of the top or bottom transducers 46, 58 would have a series resonance frequency at $1/(2*\pi*\sqrt{((Lm)*Cm)})$. The equivalent impedance of the CRS arrangement A4 is effectively that of a capacitance of $2C0$ in parallel with a series coupled inductance of $(Lm-L)/2$ and a capacitance of $2*Cm$. A symbol for the CRS arrangement A4 of FIG. 22 is provided in FIG. 24.

Figure 25:
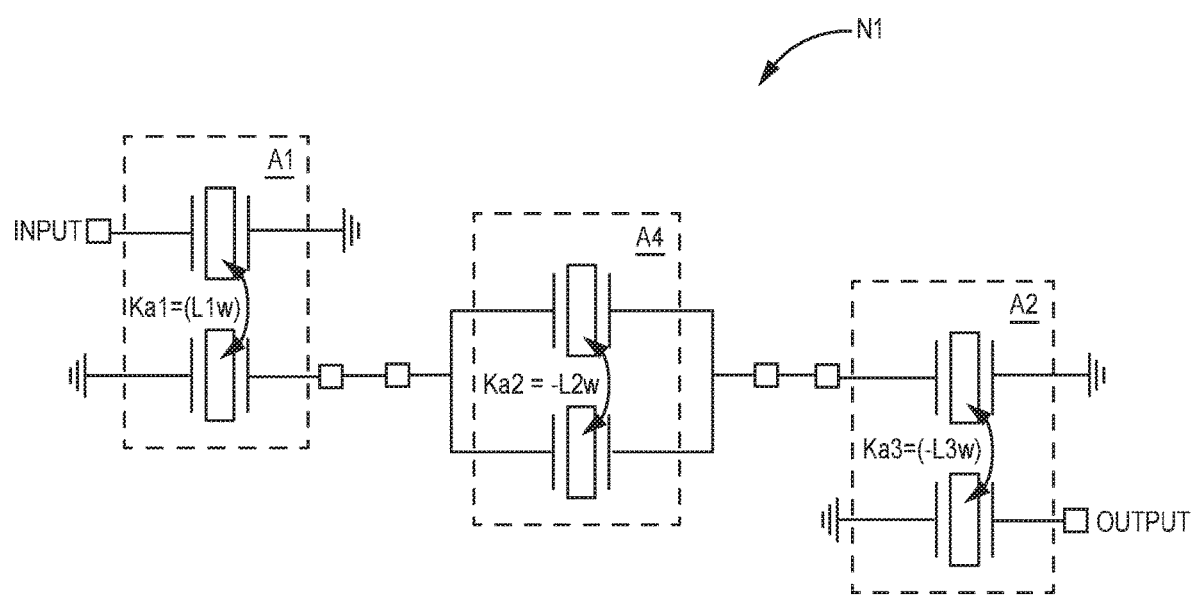
FIG. 25 is a first filter network embodiment.
Figure 26:
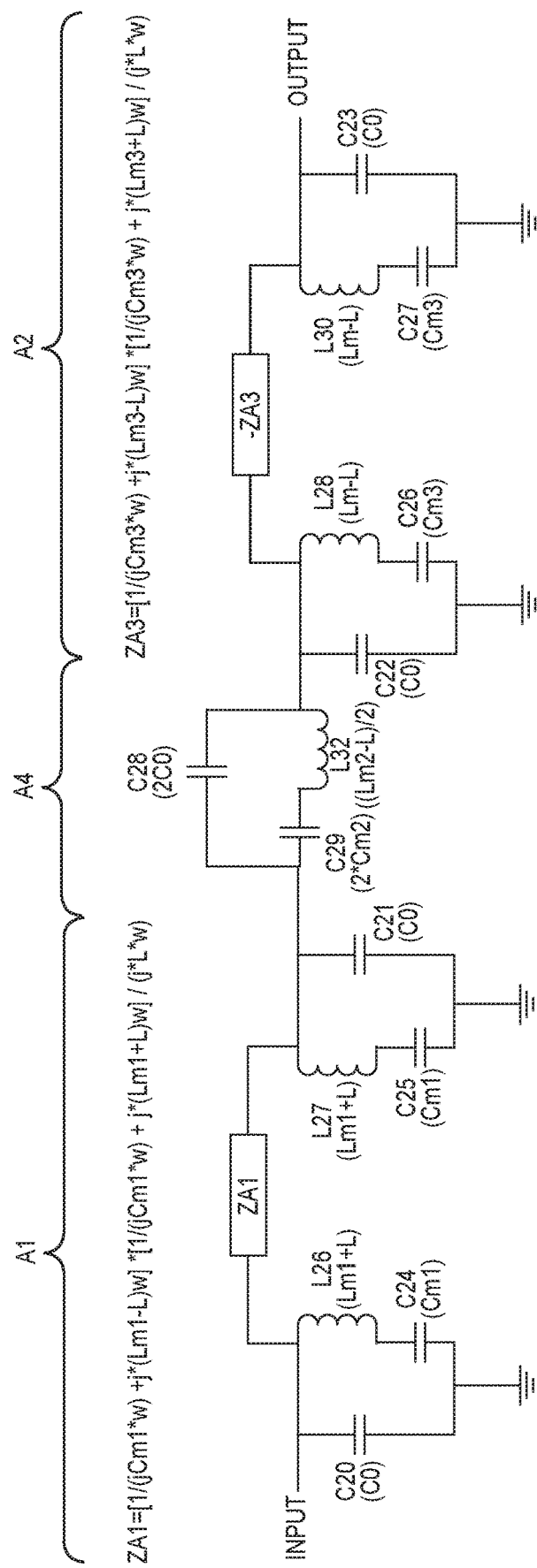
FIG. 26 is an electrical equivalent of the first filter network embodiment of FIG. 25.

With reference to FIG. 25, filter networks, such as filter network N1, may be constructed using multiple ones of the CRS arrangements A1, A2, A3, and A4. For the filter network N1, a CRS arrangement A1 is coupled to an input, a CRS arrangement A2 is coupled to an output, and a CRS arrangement A4 is coupled between the CRS arrangements A1, A2, as illustrated. This configuration is provided merely as an example, as any number of CRS arrangements AX may be employed in a variety of ways to provide a desired transfer function. The equivalent impedance of the filter network N1 is illustrated in FIG. 26. The equivalent inductance values for CRS arrangement A2 is $Lm1+L$, the equivalent inductance for CRS arrangement A4 is $(Lm2-L)/2$, and the equivalent inductance for the CRS arrangement A2 is $Lm3-L$. Again, the exact same CRS structure may be employed in each of the CRS arrangements A1, A4, and A2, yet the different configurations allow each of these CRS arrangements A1, A4, and A2 to have different series resonance frequencies based on the equivalent inductance values (i.e. $Lm+L$, $Lm-L$).

Notably, the configurations for each of the CRS arrangements A1, A4, A2, may be the same or different with respect to size, shape, layer thicknesses, series resonance frequencies, and the like. These differences are represented by the variations in component and coupling values. For CRS arrangement A1, there is a positive coupling coefficient equal to $Ka1=L1w$, for CRS arrangement A4, there is a negative coupling coefficient represented by $Ka2=-L2w$, and for CRS arrangement A2, there is a negative coupling coefficient represented by $Ka3=-L3w$.

Accordingly, for the CRS arrangement A1, impedance $Za1=[1/(jCm1*w)+j*(Lm1-L)w]*[1/(jCm1*w)+j*(Lm1+L)w]/(j*L*w)$, for impedance $Za3$ of CRS arrangement A2, $Za3=[1/(jCm3*w)+j*(Lm3-L)w]*[1/(jCm3*w)+j*(Lm3+L)w]/(j*L*w)$. For CRS arrangement A4, the impedance is represented by a capacitance of $2C0$ in parallel with a capacitance of $2*Cn2$ in series with an inductance $(Ln2-L)/2$. For FIG. 26, capacitors C20, C21, C22, and C23 have a capacitance of $C0$, capacitors C24 and C25 have a capacitance of $Cn1$, capacitors C26 and C27 have a capacitance of $Cn3$, capacitor C28 has a capacitance of $2C0$, and capacitor C29 has a capacitance of $2*Cn2$. Inductors L26 and L27 have inductances of $Lm1+L$, inductors L28 and L30 have inductances of $Lm3-L$, and inductor L32 has an inductance of $(Lm2-L)/2$.

Figure 27:
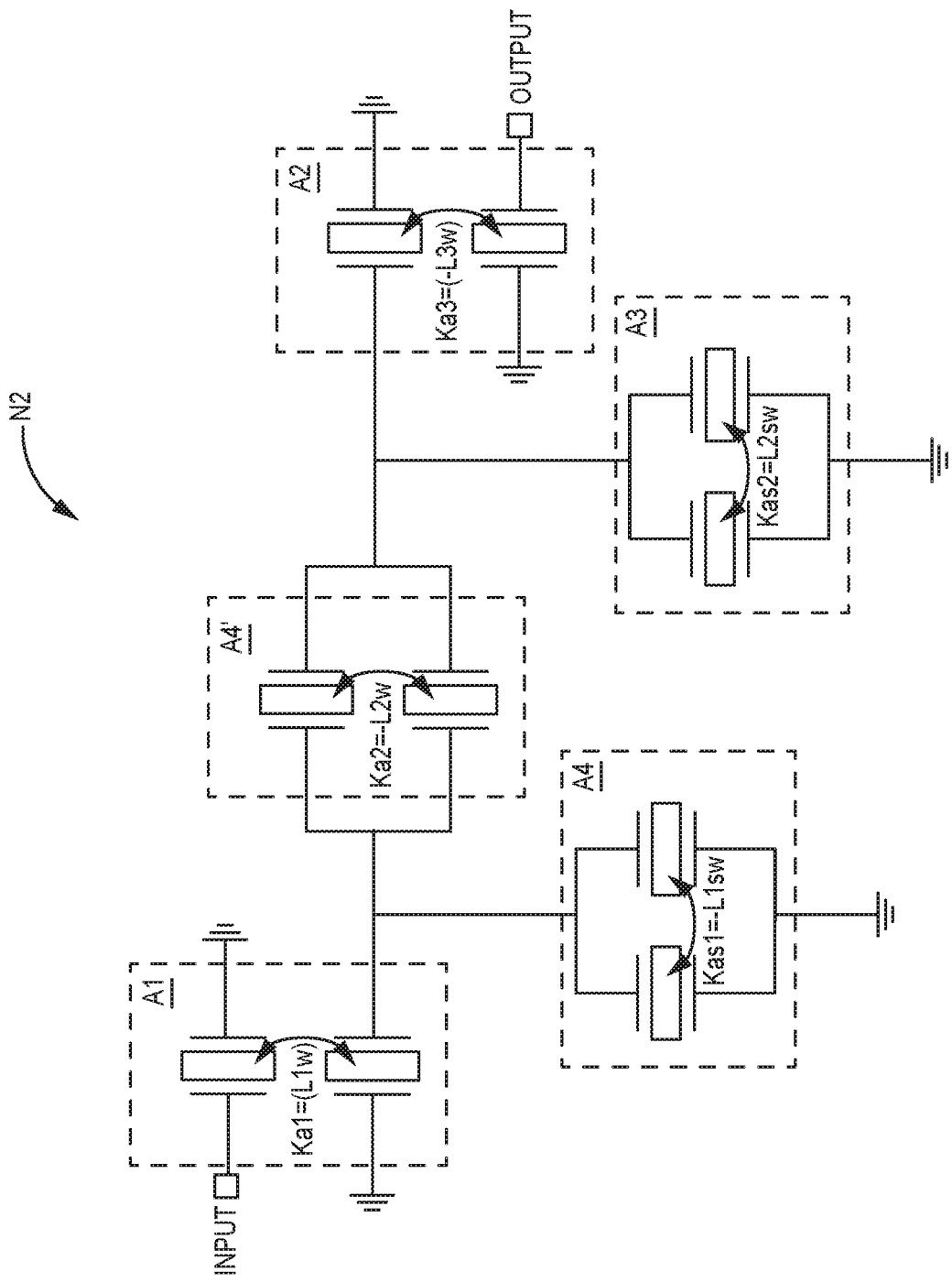
FIG. 27 is a second filter network embodiment.

Another filter example N2 is provided in FIG. 27, wherein five CRS arrangements A1, A2, A3, A4, and A4' are illustrated. CRS arrangement A1 is coupled between an input and port P1, CRS arrangement A4' is coupled between port P1 and port P2, and CRS arrangement A2 is coupled between port P2 and the output. Further, a first shunt CRS arrangement A4 is coupled between port P1 and ground, or other fixed voltage node. CRS arrangement A3 is coupled between port P2 and ground, or other fixed voltage node. CRS arrangement A1 is positively coupled with an acoustic coupling coefficient $Ka1=L1w$. CRS arrangement A4 is negatively coupled with a coupling coefficient of $Kas1=L1sw$. CRS arrangements A1 and A4 employ identical CRSes, but are electrically connected in different manners. CRS arrangement A4' is also negatively coupled and has an acoustic coupling coefficient of $Ka2=-L2w$. CRS arrangement A3 is positively coupled with an acoustic coupling coefficient of $Kas2=L2sw$. CRS arrangements A4' and A3 have identical CRSes, but are electrically coupled differently. CRS arrangement A2 is negatively coupled and has an acoustic coupling coefficient of $Ka3=-L3w$. The different coupling coefficients indicate that the structure of the CRSes in CRS arrangements A1 and A4 are the same, the structures of the CRSes of CRS arrangements A4' and A3 are the same, but are different than the structures of either of the CRSes for the CRS arrangement of A1, A4, and A2.

Figure 24:
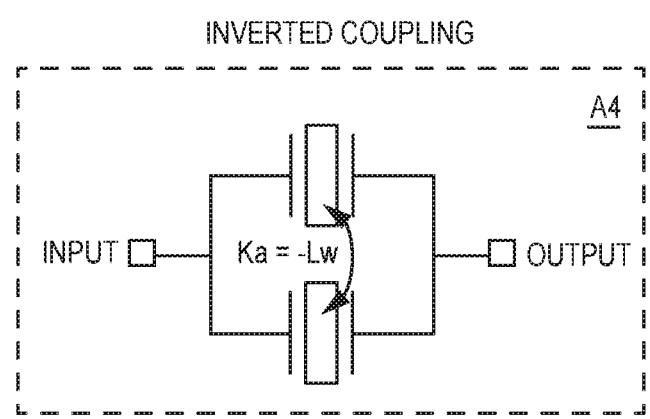
FIG. 24 is an electrical equivalent of the fourth CRS arrangement.
Figure 28:
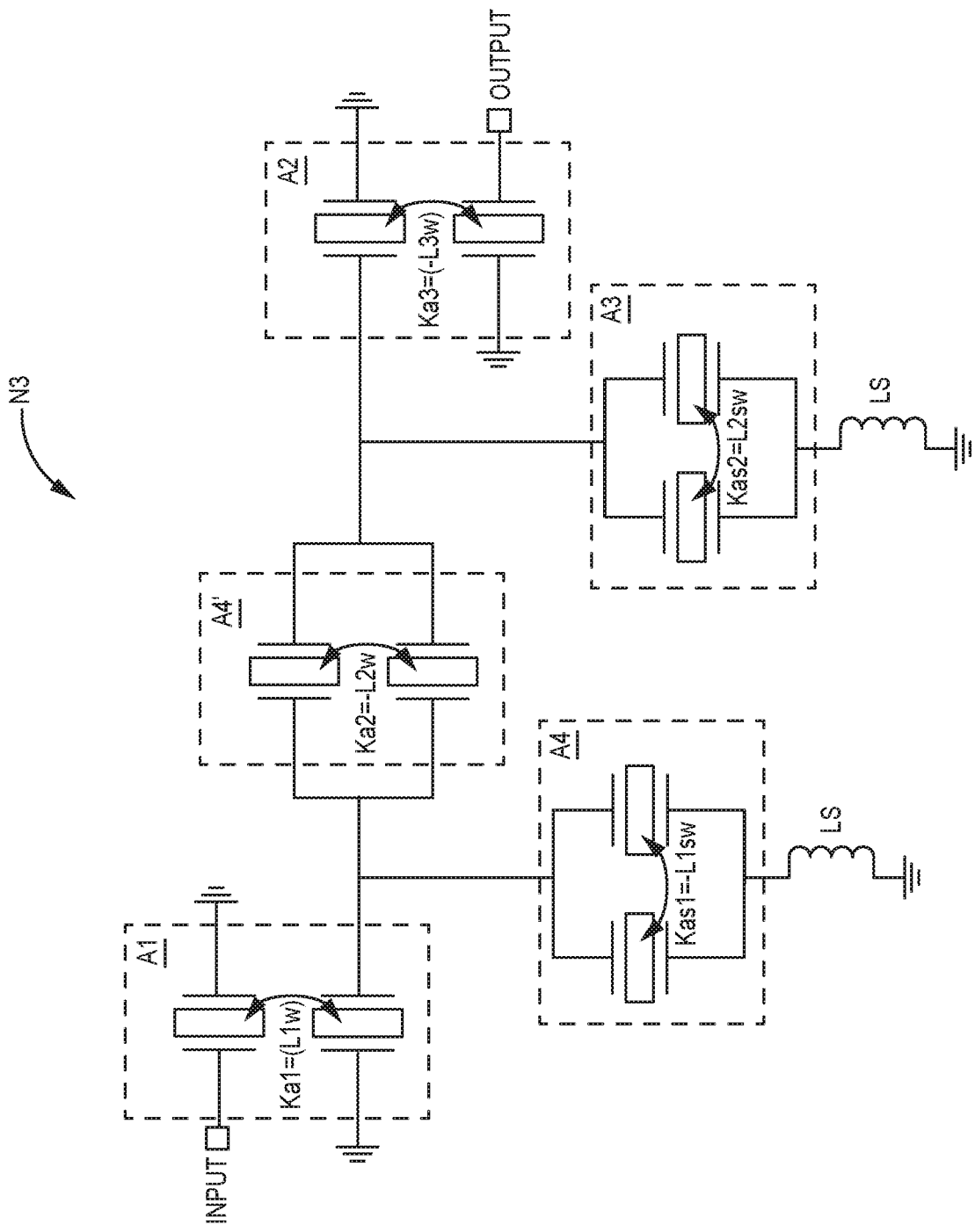
FIG. 28 is a third filter network embodiment.

FIG. 28 illustrates a filter network N3, which is a variant of the filter network N2 of FIG. 24. The difference is that shunt inductors LS are coupled in series with the CRS arrangements A4 and A3 respectively, and ground. With the additional inductances provided in the CRS arrangements A4, A3, the inductance that is often provided in the shunt elements for a ladder network may be reduced, which in turn reduces cost and the space required for the filter network N3.

Figure 29:
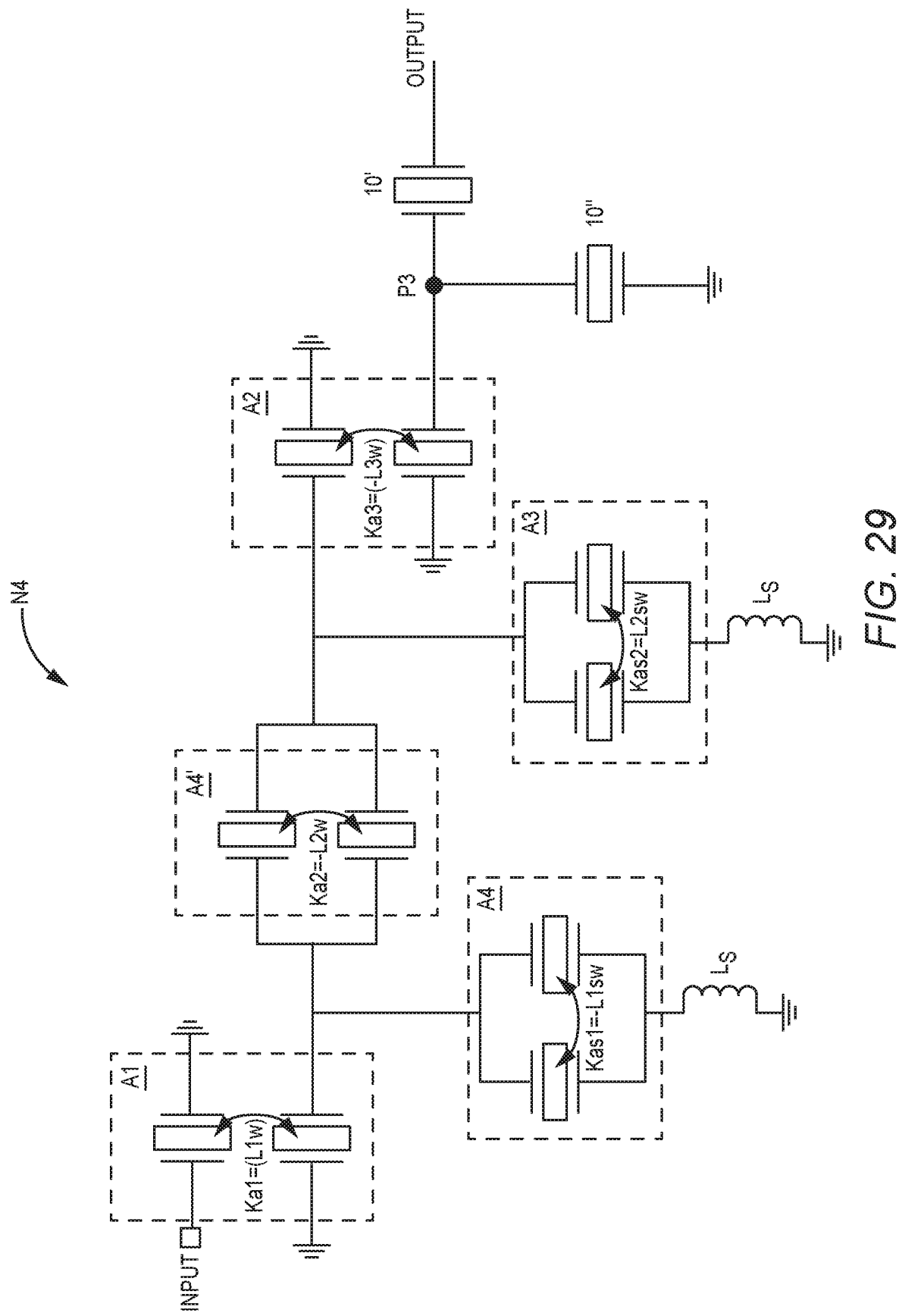
FIG. 29 is a fourth filter network embodiment.

Yet another variant is illustrated in FIG. 29. In essence, filter network N4 is an extension of filter network N2, and combines both CRS arrangements A1, A2, A3, A4, and A4' with at least two additional BAW resonators 10' and 10". In particular, CRS arrangement A1 is coupled between the input and port P1, CRS arrangement A4' is coupled between port P1 and P2, CRS arrangement A2 is coupled between port P2 and port P3, and BAW resonator 10' is coupled between port P3 and the output. In a shunt arrangement, CRS arrangement A4 is coupled between port P1 and ground, CRS arrangement A3 is coupled between port P2 and ground, and BAW resonator 10" is coupled between port P3 and ground.

Figure 30:
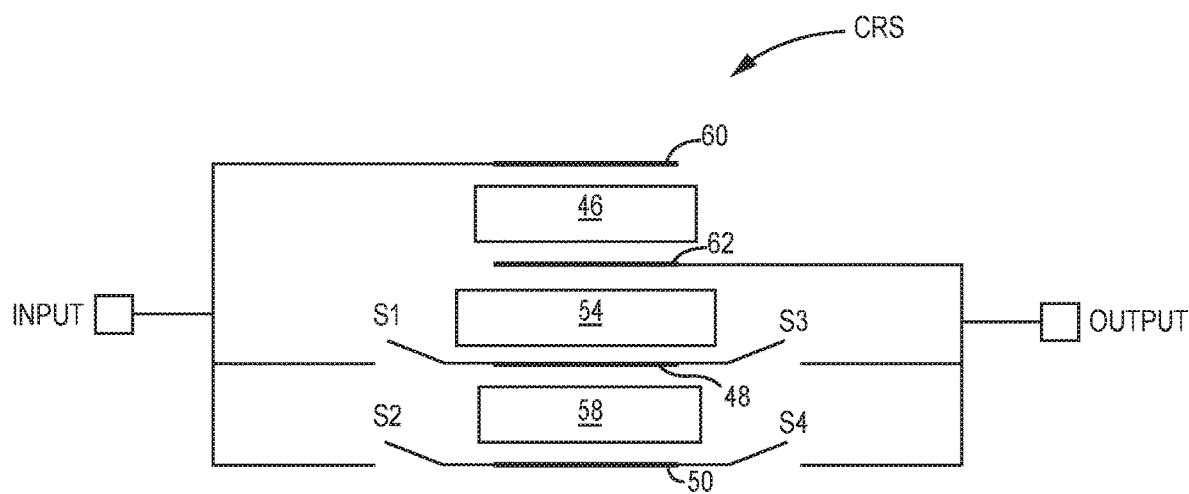
FIG. 30 is a switchable CRS arrangement.

FIG. 30 illustrates a circuit configuration that allows for the CRS arrangement to be tunable, or configurable, by employing switches S1-S4. In particular, an input is coupled to the top electrode 60 of the top transducer 46 and to one side of both switches S1 and S2. The output is coupled to the bottom electrode 62 of the top transducer 46, as well as the first terminal of switches S3 and S4. The second terminals of switches S1 and S3 are coupled to the top electrode 48 of the bottom transducer 58. Similarly, the second terminals of switches S2 and S4 are coupled to the bottom electrode 50 of the bottom transducer 58. Closing switches S2 and S3 while leaving switches S1 and S4 open provides CRS arrangement A3. Closing switches S1 and S4 while leaving switches S2 and S3 open provides CRS arrangement A4. As such, the use of switches, such as switches S1-S4, allow a given CRS to be dynamically configured as either CRS arrangement A3 or A4, respectively.

Figure 31:
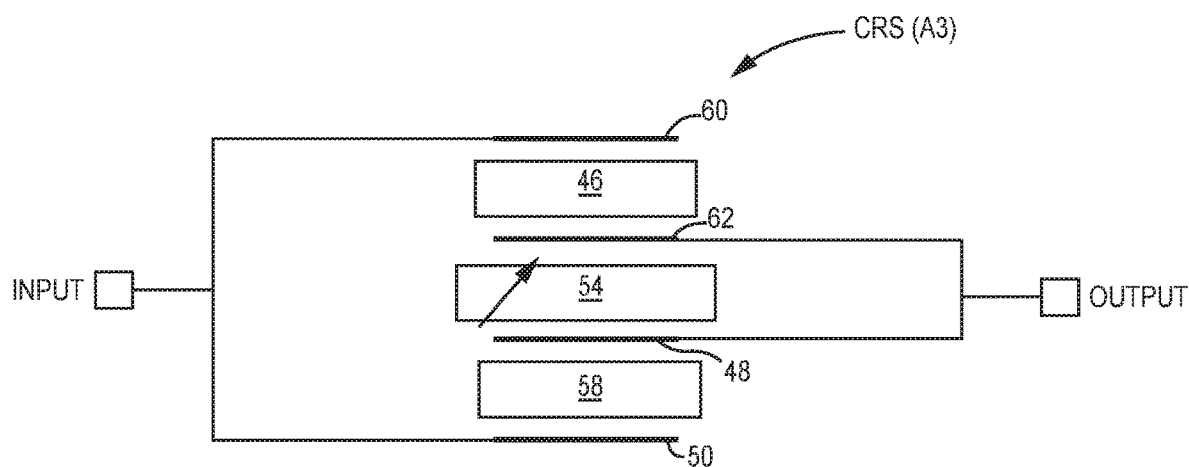
FIG. 31 is a first tunable CRS arrangement.
Figure 32:
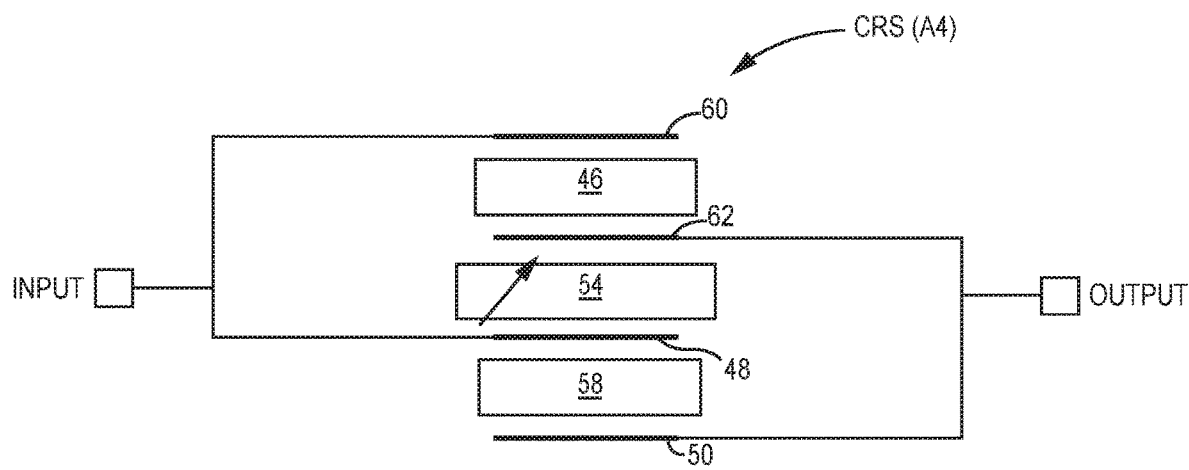
FIG. 32 is a second tunable CRS arrangement.

FIGS. 31 and 32 illustrate a tunable CRS arrangements for CRS arrangements A3 and A4. The tuning may be dynamically applied after manufacture, or varied and then set during manufacturing. The tuning includes employing techniques to modify the acoustic coupling coefficient Ka that is provided by the coupling structure 54. Since tuning could be provided by changing material thicknesses, compositions, adding or subtracting metallic or non-metallic elements, blowing fuses, or the like that would effectively modify the acoustic coupling coefficient in a known manner. For the CRS arrangement A3 of FIG. 31, changing the acoustic coupling coefficient Ka effectively changes the effective inductance L in the equation $(Lm+L)/2$. Similarly, For the CRS arrangement A4 of FIG. 32, changing the acoustic coupling coefficient Ka effectively changes the effective inductance L in the equation $(Lm-L)/2$.

Figure 33:
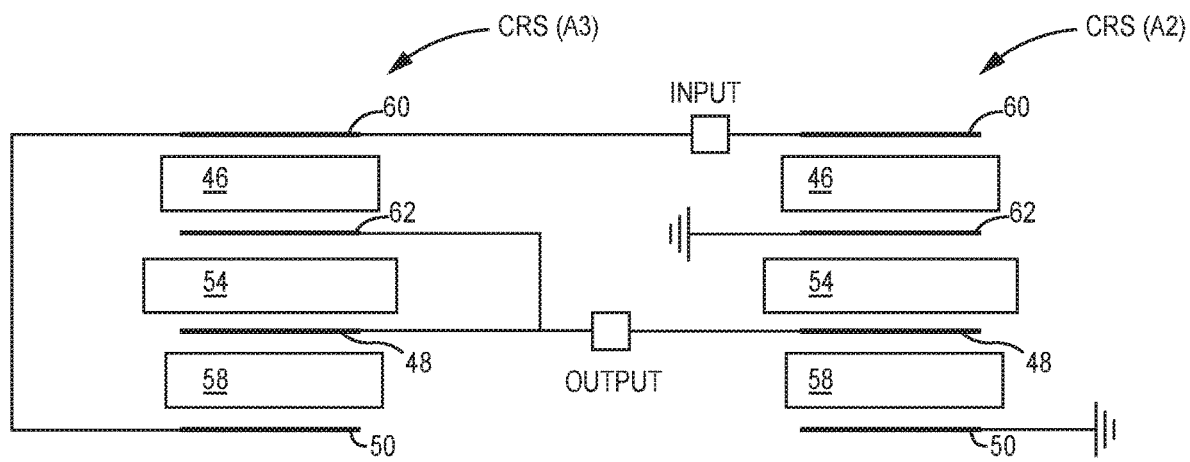
FIG. 33 is a fifth filter network embodiment.
Figure 34:
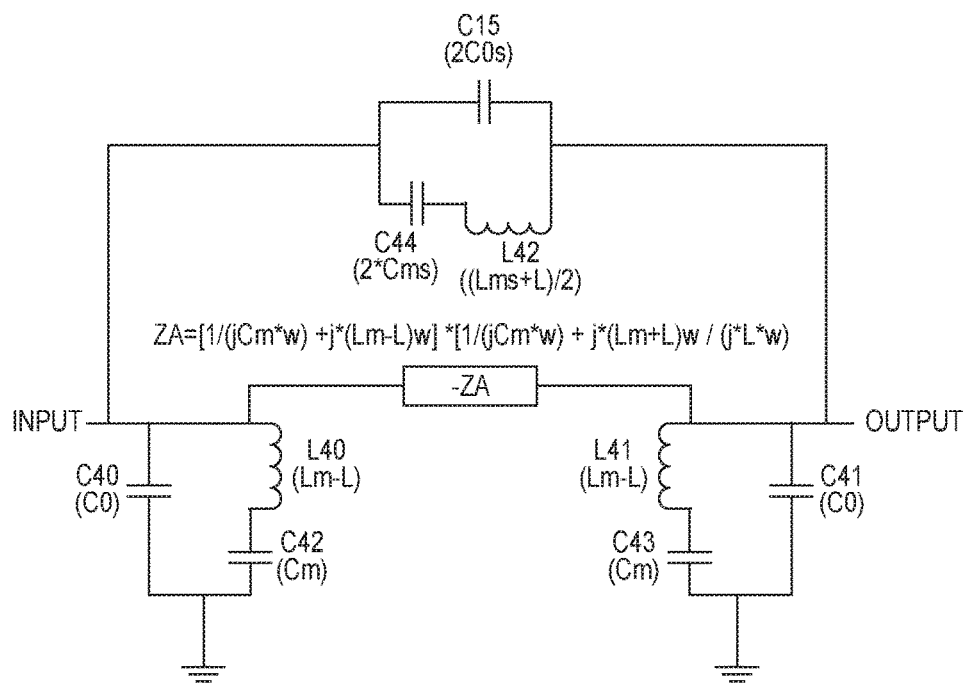
FIG. 34 is an electrical equivalent of the third filter network embodiment of FIG. 33.

FIG. 33 illustrates yet another embodiment, wherein a CRS arrangement A3 is coupled in parallel with a CRS arrangement A2. The equivalent impedance is illustrated in FIG. 34. For FIG. 34, capacitors C40 and C41 have capacitances of C0, capacitors C42 and C43 have capacitances of Cm, capacitor C44 has a capacitance of 2*Cms, and capacitor C45 has a capacitance of 2C0s. Inductors L40 and L41 have inductances of Lm−L, and inductor L42 has an inductance of (Lms+L)/2.

FIG. 35 illustrates yet another embodiment, wherein a CRS arrangement A4 is coupled in parallel with a CRS arrangement A2. The equivalent impedance is illustrated in FIG. 36. For FIG. 236, capacitors C40 and C41 have capacitances of C0, capacitors C42 and C43 have capacitances of Cm, capacitor C44 has a capacitance of 2*Cms, and capacitor C45 has a capacitance of 2C0s. Inductors L40 and L41 have inductances of Lm−L, and inductor L42 has an inductance of (Lms−L)/2.

FIG. 37 illustrates yet another embodiment, wherein a CRS arrangement A3 is coupled in parallel with a CRS arrangement A1. The equivalent impedance is illustrated in FIG. 38. For FIG. 38, capacitors C40 and C41 have capacitances of C0, capacitors C42 and C43 have capacitances of Cm, capacitor C44 has a capacitance of 2*Cms, and capacitor C45 has a capacitance of 2C0s. Inductors L40 and L41 have inductances of Lm+L, and inductor L42 has an inductance of (Lms+L)/2.

Figure 39:
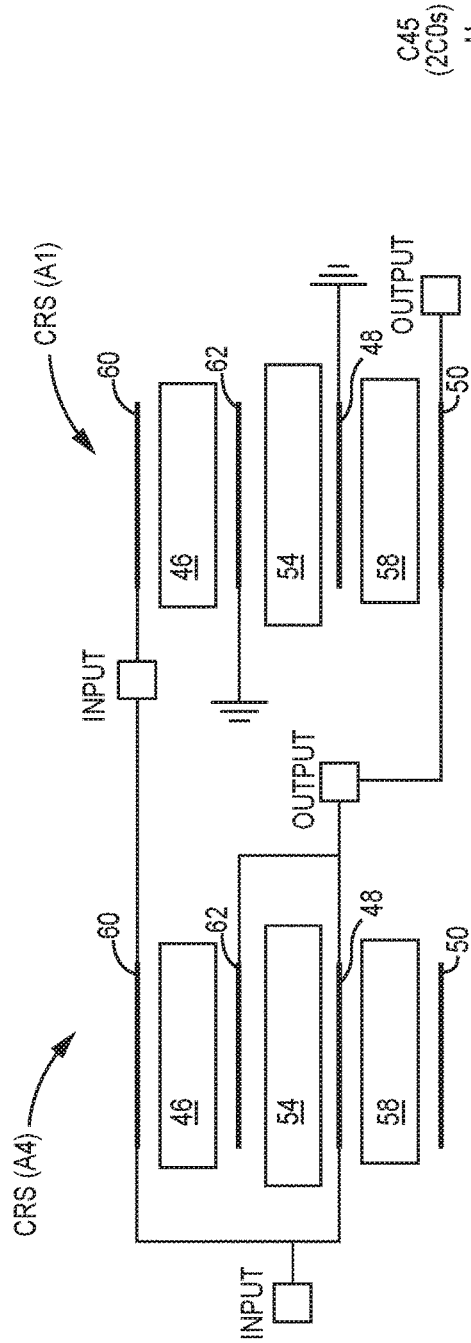
FIG. 39 is an eighth filter network embodiment.
Figure 40:
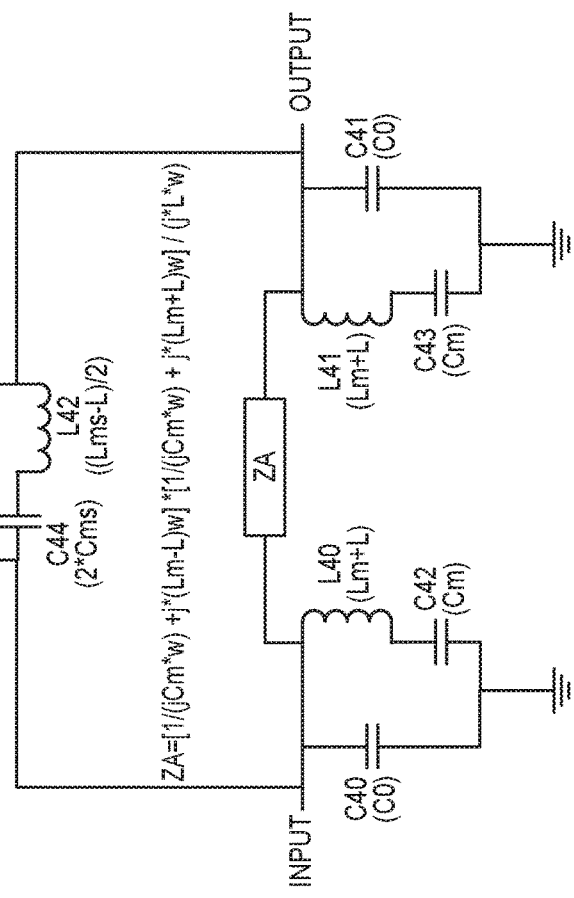
FIG. 40 is an electrical equivalent of the third filter network embodiment of FIG. 39.

FIG. 39 illustrates yet another embodiment, wherein a CRS arrangement A4 is coupled in parallel with a CRS arrangement A1. The equivalent impedance is illustrated in FIG. 40. For FIG. 40, capacitors C40 and C41 have capacitances of C0, capacitors C42 and C43 have capacitances of Cm, capacitor C44 has a capacitance of 2*Cms, and capacitor C45 has a capacitance of 2C0s. Inductors L40 and L41 have inductances of Lm+L, and inductor L42 has an inductance of (Lms−L)/2. FIGS. 33-40 illustrate embodiments that may be referred to as an N-tail or transversal filter. For further details on such filters that are constructed of BAW resonators 10, reference is made to U.S. Pat. No. 9,698,756; and to U.S. patent application Ser. No. 15/275,957 filed Sep. 26, 2016; Ser. No. 15/347,428 filed Nov. 9, 2016; Ser. No. 15/586,374 filed May 4, 2017; Ser. No. 15/697,658 filed Sep. 7, 2017; and Ser. No. 15/701,759 filed Sep. 12, 2017, the disclosures of which are incorporated herein by reference in their entireties.

FIG. 41 illustrates a CRS arrangement A3 in parallel with a CRS arrangement A4, wherein the resulting structure is equivalent to a single BAW resonator 10. The equivalent impedance networks are illustrated in FIGS. 42A and 42B. FIG. 42A shows that the equivalent impedance looks like two parallel BAW resonators of the same configuration, which reduces to the equivalent shown in FIG. 42B, wherein the impedance equivalent is represented by a capacitance of 4C0s in parallel with an LC impedance Z', wherein Z'=[1/(j*2*Cm*w)+j*(Lm−L)/2*w]*[1/(j*2*Cm*w)+j*(Lm+L)/2*w]/[1/(j*Cm*w)+j*Lm*w]. For FIG. 42A, capacitors C50 and C51 have capacitances of 2C0s, capacitors C52 and C53 have capacitances of 2*Cm, inductor L50 has an inductance of (Lm+L)/2, and inductor L51 has an inductance of (Lm−L)/2. For FIG. 42B, capacitor C60 has a capacitance of 4C0s, capacitors C61 and C62 have capacitances of 2*Cm, inductor L60 has an inductance of (Lm−L)/2, and inductor L61 has an inductance of (Lm+L)/2.

Notably, the same or similarly sized BAW resonators 10' and 10" as well as the CRS arrangements A1, A2, A3, A4, and A4', may include transducers of the same or similar size, yet the ability to change the electrical connections to change the series resonance frequencies fs provide tremendous flexibility in using similarly sized transducers while achieving the different series resonance frequencies, which are often needed to create various filters, including ladder filters.

What is claimed is:

1. A device comprising:
   a network input and a network output;
   a filter network coupled between the network input and the network output and comprising a plurality of coupled resonator structures (CRSes) that are electrically coupled together to form a ladder network, wherein each coupled resonator structure (CRS) comprises:
   a substrate;
   a bottom transducer comprising a first bottom electrode over the substrate, a first piezoelectric layer over the first bottom electrode, and a first top electrode over the first piezoelectric layer;
   a first acoustic coupling structure over the bottom transducer; and
   a top transducer over the first acoustic coupling structure and comprising a second bottom electrode, a second piezoelectric layer over the second bottom electrode, and a second top electrode over the second piezoelectric layer, wherein the bottom transducer is vertically acoustically coupled to the top transducer via the first acoustic coupling structure,
   wherein an arrangement of a first CRS of the plurality of CRSes comprises a second arrangement, and an arrangement of a second CRS of the plurality of CRSes is one of a first arrangement, a third arrangement, and a fourth arrangement, wherein:
   in the first arrangement, the second top electrode is a first terminal, the first bottom electrode is a second terminal, and the first top electrode is directly electrically coupled to the second bottom electrode to provide a third terminal of a first three terminal device;
   in the second arrangement, the second top electrode is a fourth terminal, the first top electrode is a fifth terminal, and the first bottom electrode is directly electrically coupled to the second bottom electrode to provide a sixth terminal of a second three terminal device;
   in the third arrangement, the first bottom electrode is directly electrically coupled to the second top electrode to provide a seventh terminal and the first top electrode is directly electrically coupled to the second bottom electrode to provide an eighth terminal of a first two terminal device; and
   in the fourth arrangement, the first bottom electrode is directly electrically coupled to the second bottom electrode to provide a ninth terminal and the first top electrode is directly electrically coupled to the second top electrode to provide a tenth terminal of a second two terminal device.

2. The device of claim 1 wherein the top transducer of the first CRS is structurally identical to the top transducer of the second CRS, and the bottom transducer of the first CRS is structurally identical to the bottom transducer of the second CRS.

3. The device of claim 2 wherein the first CRS has a first series resonance frequency, and the second CRS has a second series resonance frequency that is different than the first series resonance frequency.

4. The device of claim 1 wherein the first CRS has a first series resonance frequency, and the second CRS has a second series resonance frequency that is different than the first series resonance frequency.

5. The device of claim 1 wherein the first CRS is a shunt element of the ladder network, and the second CRS is a series element of the ladder network.

6. The device of claim 1 wherein an arrangement of a third CRS of the plurality of CRSes is a different one of the first arrangement, the second arrangement, the third arrangement, and the fourth arrangement than the arrangement of the first CRS and the arrangement of the second CRS.

7. The device of claim 1 wherein the filter network further comprises at least one BAW resonator that is electrically coupled to the plurality of CRSes.

8. The device of claim 7 wherein the first CRS has a first series resonance frequency, the second CRS has a second series resonance frequency that is different than the first series resonance frequency, and the at least one BAW resonator has a third series resonance frequency that is different than the first and second series resonance frequencies.

9. The device of claim 1 wherein the first CRS has the second arrangement, and the second CRS has the first arrangement.

* * * * *

UNITED STATES PATENT AND TRADEMARK OFFICE
CERTIFICATE OF CORRECTION

PATENT NO. : 11,165,413 B2  
APPLICATION NO. : 15/883933  
DATED : November 2, 2021  
INVENTOR(S) : Nadim Khlat and Robert Aigner Page 1 of 1

It is certified that error appears in the above-identified patent and that said Letters Patent is hereby corrected as shown below:

In the Specification

Column 12, Line 34, replace "$2CO_3$" with --$2CO$--.

Signed and Sealed this  
Twenty-second Day of February, 2022

Drew Hirshfeld  
*Performing the Functions and Duties of the*  
*Under Secretary of Commerce for Intellectual Property and*  
*Director of the United States Patent and Trademark Office*